United States Patent [19]

McKeen

[11] Patent Number: 5,175,544
[45] Date of Patent: Dec. 29, 1992

[54] DIGITALLY CONTROLLED BIT SYNCHRONIZER

[75] Inventor: David R. McKeen, Lexington Park, Md.

[73] Assignee: Veda Systems Incorporated, California, Md.

[21] Appl. No.: 515,833

[22] Filed: Apr. 27, 1990

[51] Int. Cl.$^5$ .................. H03M 7/00; H04L 7/00
[52] U.S. Cl. .................. 341/52; 375/106; 375/111
[58] Field of Search .............. 341/52, 53, 54, 58; 375/25, 106, 111

[56] References Cited

U.S. PATENT DOCUMENTS

| | | | |
|---|---|---|---|
| 4,020,282 | 4/1977 | Halpern | 341/58 X |
| 4,112,372 | 9/1978 | Holmes et al. | 375/111 X |
| 4,617,674 | 10/1986 | Mangulis et al. | 375/111 X |

OTHER PUBLICATIONS

"Vol. 1, Technical Proposal" submitted to the Navy by Veda, Inc. and dated Jul. 7, 1988.

Primary Examiner—Sharon D. Logan
Attorney, Agent, or Firm—Finnegan, Henderson, Farabow, Garrett & Dunner

[57] ABSTRACT

A digitally controlled bit synchronizer and method for converting a pulse code modulated input signal having a known IRIG code into a filtered NRZ-L formatted output signal in phase with a predetermined clock signal. The bit synchronizer and method utilize a four-pole filter element, peak detector and reset circuits for removing AC offset, a variable controlled oscillator for adjusting the phase of the clock, Miller, Bi-Phase, and NRZ decoders, and a microprocessor for digitally controlling their operation and interconnection.

29 Claims, 31 Drawing Sheets

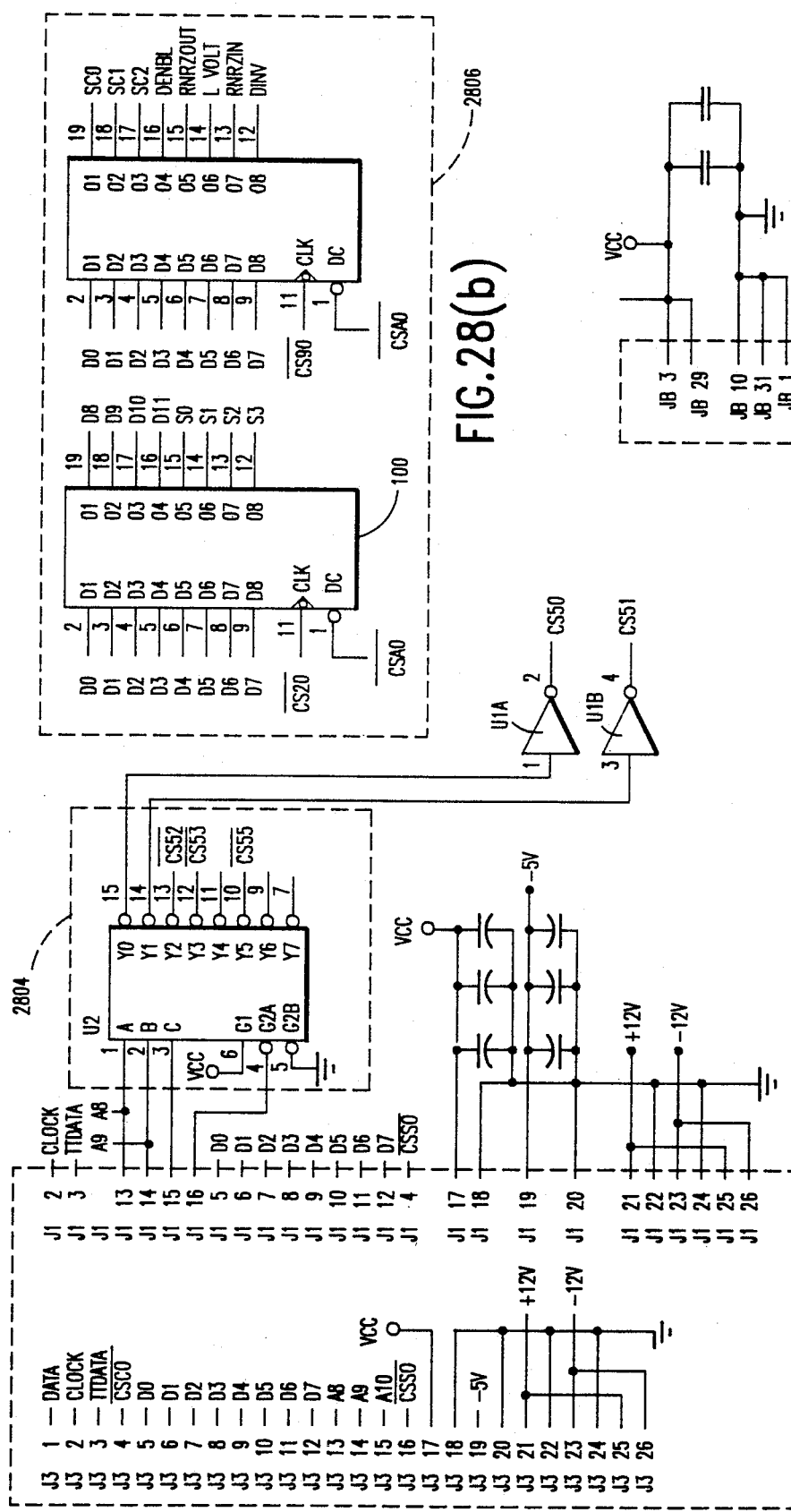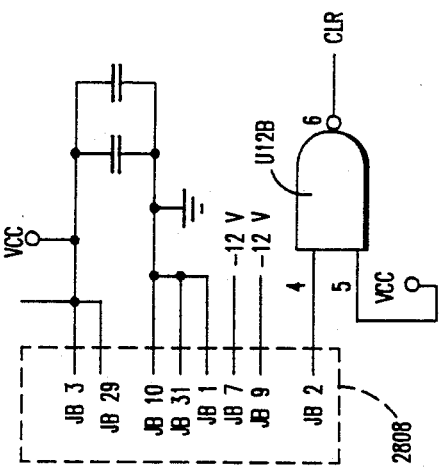
FIG.28(a)
FIG.28(b)
FIG.28(c)

DIGITALLY CONTROLLED BIT SYNCHRONIZER

BACKGROUND OF THE INVENTION

1. Field of the Invention

This invention relates to a bit synchronizer and, more particularly, to a digitally controlled, light weight, low power bit synchronizer.

2. Description of the Related Art

Telemetry data received for processing inherently picks up unwanted noise, typically called "white noise," during transmission. The data of the telemetry signal must be filtered into a clean signal before various processors can convert the data into useful information. In addition, the telemetry data may be in one of the many standard Inter-Range Institution Group (IRIG) code formats, and may need to be converted into a code format compatible with downstream devices or with recording devices for subsequent processing.

It is desirable to perform the filtering and conversion process as quickly as possible, with a device that is both light and inexpensive. Known bit synchronizers mounted on circuit boards for insertion into telemetry analysis systems typically function with a maximum speed performance of 2-5 Mbit/sec. Many stand-alone bit synchronizers also have a maximum speed in the 2-5 Mbit/sec range. There are, however, a few high priced, large, and heavy bit synchronizers which will perform above 15 Mbit/sec. These units, in addition to being large and heavy, require a great deal of power.

Known bit synchronizers have power consumption requirements upward to about 75 watts, weigh up to 40 pounds, take as much as 128 bits to achieve a lock-on, and require frequent calibration. In addition, previous attempts to digitally control the filters of a bit synchronizer have been only moderately successful.

Objects of the Invention

Therefore, it is an object of the present invention to provide a digitally controlled bit synchronizer with a high performance speed and a low power requirement.

It is a further object of the present invention to provide a bit synchronizer that weighs approximately one pound or less.

It is a further object of the present invention to provide a bit synchronizer that takes one bit to lock onto a pulse code modulated data.

It is a further object of the present invention to provide a bit synchronizer that does not require periodic calibration.

Additional objects and advantages of the invention will be set forth in the description which follows, and in part will be apparent from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described in this document, an apparatus is provided that comprises input means for receiving and processing a pulse code modulated input signal having a first predetermined code format and for outputting a preliminary signal. The apparatus comprises filter means, responsive to a control means, for filtering the preliminary signal and for outputting a filtered signal. Also provided is code converter means, responsive to the control means and a clock means, for converting the filtered signal and for outputting an output data signal having a second predetermined code format. Additionally, clock means, responsive to the filtered signal, the code converter means, and the control means, are provided for outputting the output clock signal in a predetermined phase with the output data signal. Control means, responsive to user controlled inputs, are provided for digitally controlling the operation of the filter means, the code converter means, and the clock means.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Reference will now be made in detail to the presently preferred embodiments of the invention as illustrated in the accompanying drawings.

A. Background and Hardware

The invention relates to a bit synchronizer apparatus having input means, filter means, code converter means, clock means, and control means.

Figure 1:
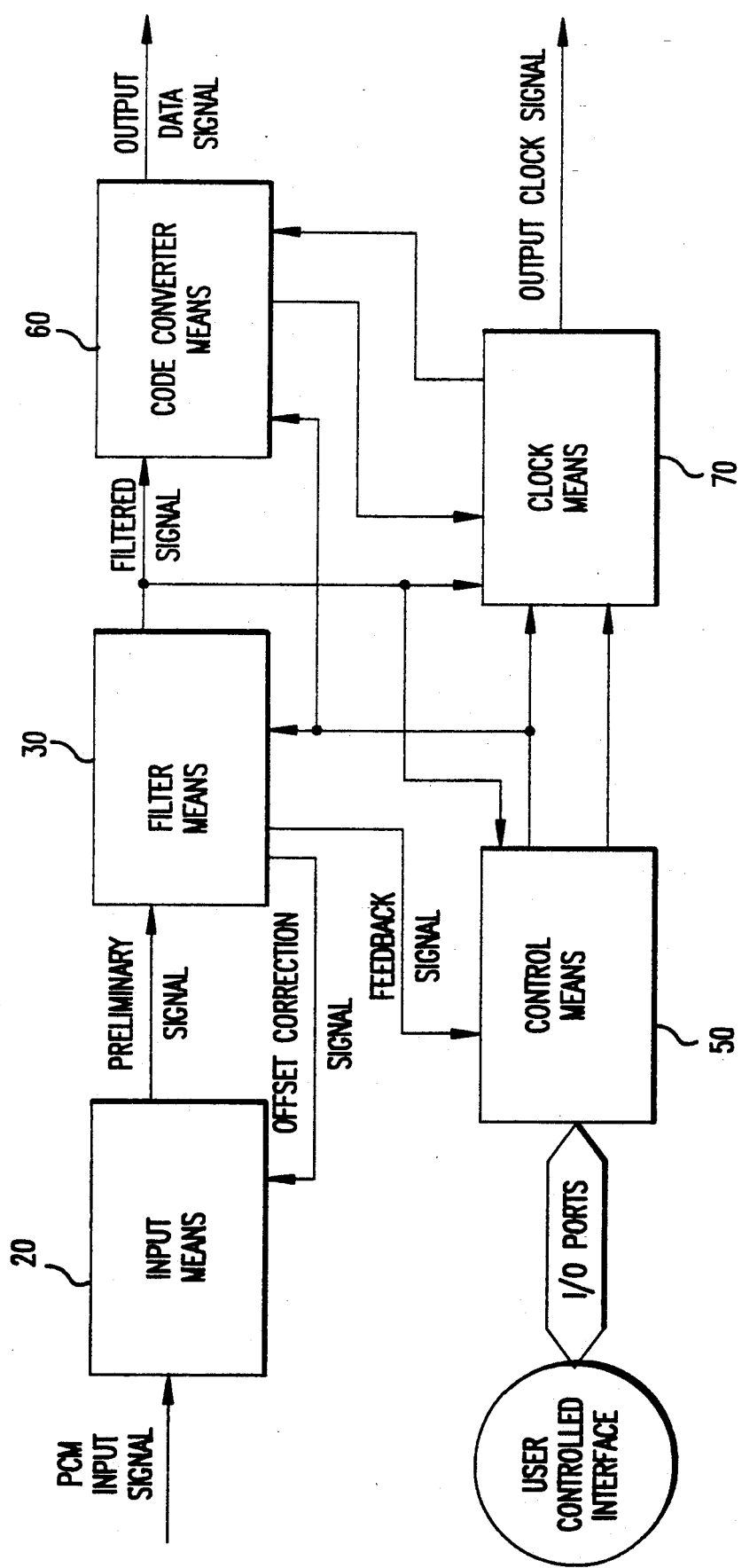
FIG. 1 is a block diagram of a preferred embodiment of the invention.

A preferred embodiment of the invention is illustrated in FIG. 1, wherein input means 20 outputs a preliminary signal to filter means 30, which, in turn, outputs a square wave filtered signal to code converter means 60. The filtered signal is also input to clock means 70 and control means 50. Code converter means 60 outputs an output data signal, while clock means 70 outputs an output clock signal. Control means 50 controls the operation of clock means 70, filter means 30, and code converter means 60. Control means 50 receives inputs from filter means 30 and clock means 70.

The preferred embodiments of the bit synchronizer of the present invention typically receive telemetry data signals in the form of pulse code modulated (PCM) signals (digital signals) from aircraft. During transmission to a ground station or to another aircraft having processing equipment including a bit synchronizer, the PCM signals often become saturated with white noise, making the PCM signal unreadable to typical processing equipment.

A purpose of a preferred embodiment of the bit synchronizer of the present invention is to synchronize the bits of data contained within the PCM signal so as to be usable by processing equipment that can utilize the data. The data bits are synchronized with a clock signal that is usable by the processing equipment in order to properly decode the data.

Another purpose of a preferred embodiment of the bit synchronizer of the present invention is to convert the code format of the PCM signal into a code format that is compatible with the processing equipment, if necessary.

With this basic understanding of a preferred embodiment of the invention, a detailed description of preferred embodiments follows. This detailed description, along with the drawings, will indicate specific values for voltages, resistances, and the like. It should be understood that these specific values, and all discussion of the preferred embodiments, are merely illustrative. The invention is that which is claimed.

In accordance with the invention, input means are provided for receiving and processing a pulse code modulated input signal having a first predetermined code format and for outputting a preliminary signal.

FIG. 1 shows a preferred embodiment wherein a pulse code modulated (PCM) input signal is input to input means 20, from which a preliminary signal is output. The PCM input signal has a predetermined IRIG code format such as NRZ-S, Bi-Phase-L, or DM-M. This PCM input signal is typically transmitted as telemetry data and is received by a receiver (not shown) and input to input means 20.

In accordance with the invention, the input means preferably includes AC coupler means for removing a DC offset of the pulse code modulated input signal and for outputting a first signal.

Figure 2:
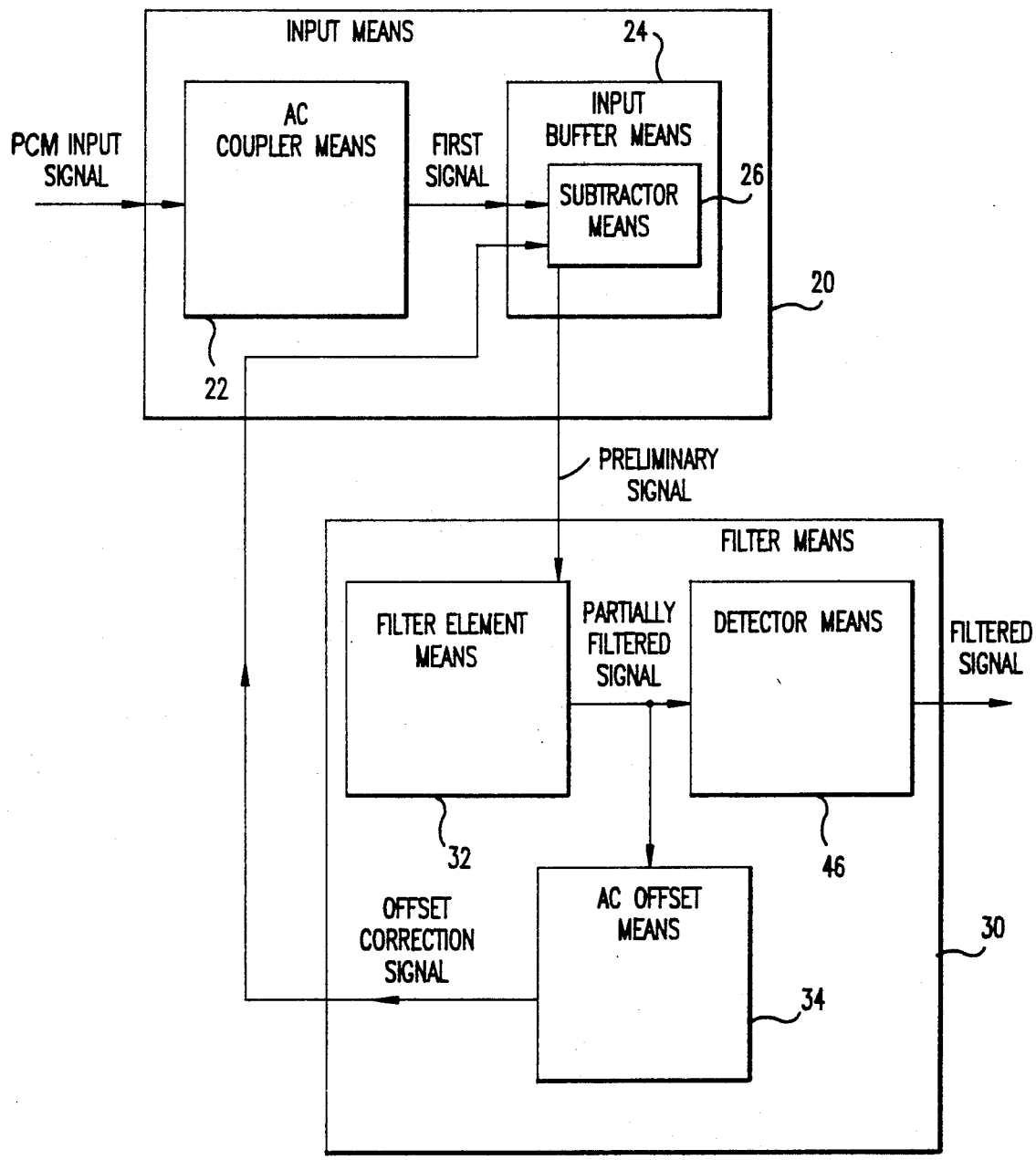
FIG. 2 shows a preferred embodiment of the input means of FIG. 1 and a preferred embodiment of the filter means of FIG. 1.
Figure 3A:
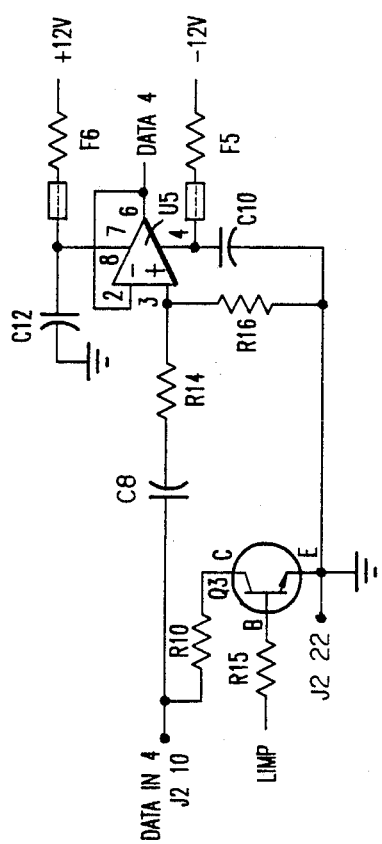
FIG. 3 shows a preferred embodiment of the AC coupler means of FIG. 2 and related circuitry.
Figure 3B:
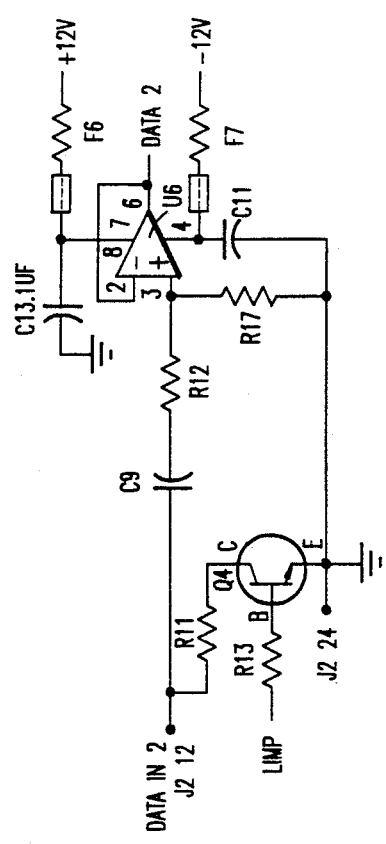
Figure 3C:
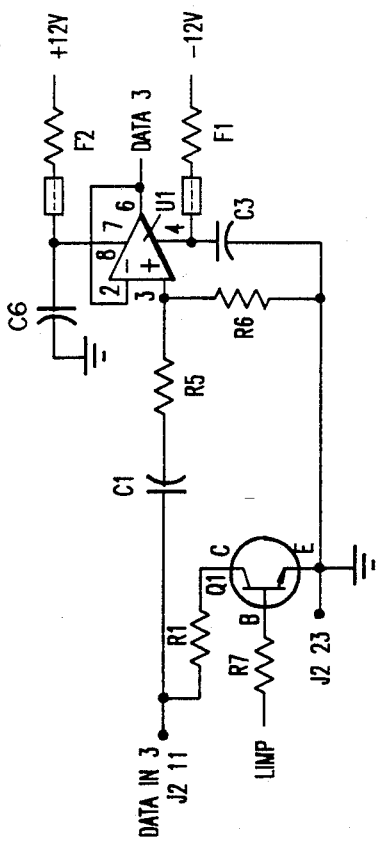
Figure 3D:
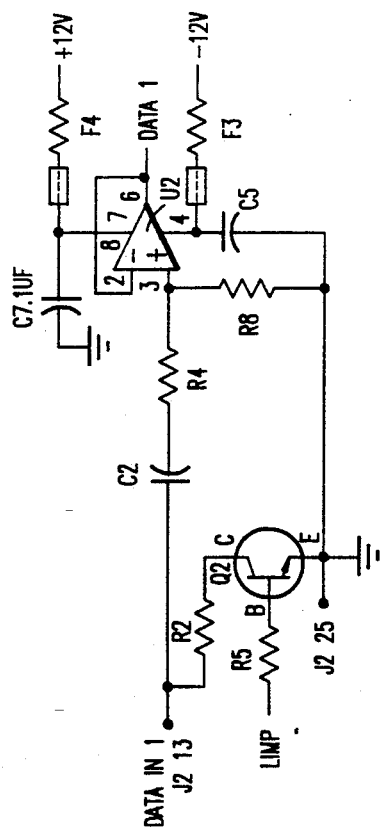

FIG. 2 shows a preferred embodiment wherein input means 20 includes AC coupler means 22, which inputs the PCM input signal and outputs a first signal, after removing the DC offset from the PCM input signal. As further illustrated in FIG. 3, the bit synchronizer may preferably include four input ports for receiving four separate PCM input signals, illustrated as DATA IN 1, DATA IN 2, DATA IN 3, and DATA IN 4. AC coupler means 22 for each DATA IN signal is illustrated by capacitor C2, C9, C1, and C8, respectively. While four separate PCM input signals may be received simultaneously, only one PCM input signal may be selected for processing at any one time, as described below with reference to FIG. 4.

As shown in FIG. 3, each DATA IN circuit includes a LIMP input for setting the input impedance level to either a high (10,000 ohms) or a low impedance (75 ohms). Each DATA IN circuit also serves to attenuate the DATA IN signal. As a result of experimentation, the presently preferred mode of operation is to attenuate the input signal by a factor of 4.

Figure 4:
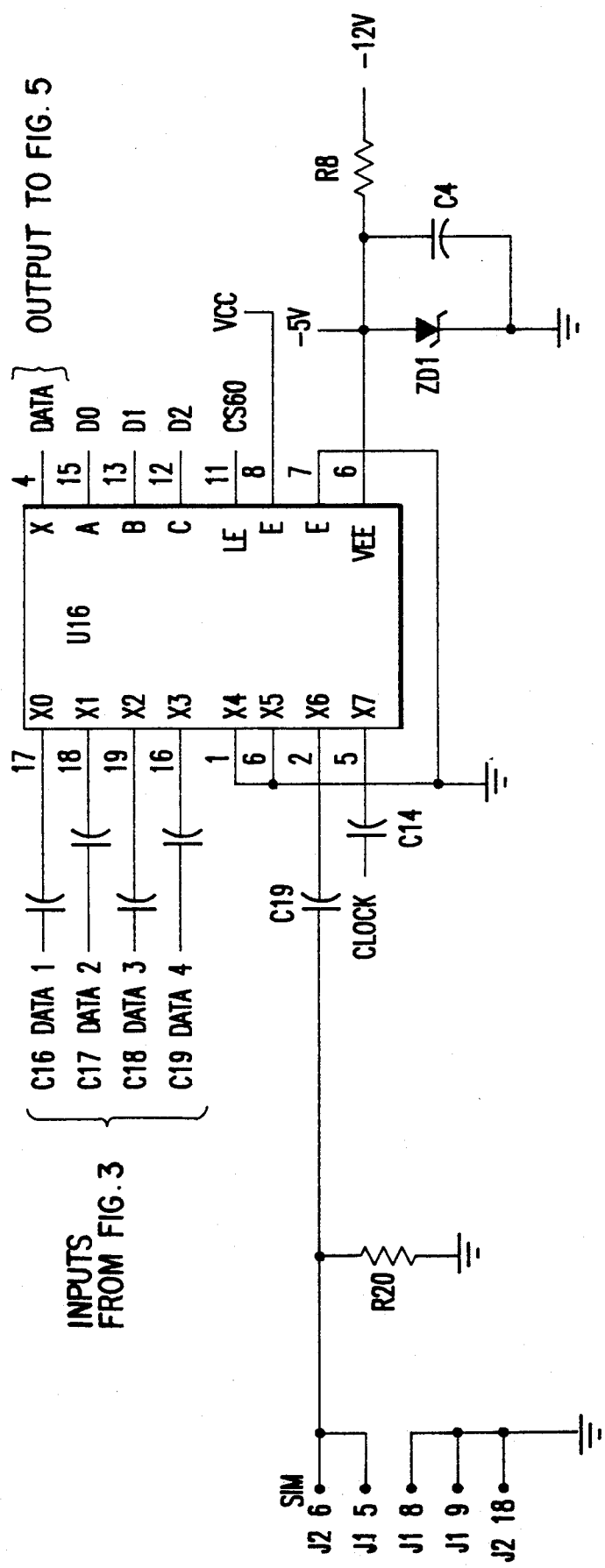
FIG. 4 shows a preferred embodiment of a circuit for selecting the first signal of FIG. 2.

The outputs of each separate DATA IN circuit are shown in FIG. 3 as DATA 1, DATA 2, DATA 3 and DATA 4, respectively. As shown in FIG. 4, the outputs from the DATA IN circuits are input to multiplexer U16, which also inputs a simulated input signal (SIM) and a clock signal (CLOCK). A human operator of the bit synchronizer is able to choose between SIM, CLOCK, DATA 1, DATA 2, DATA 3, and DATA 4 as the desired PCM input signal by selecting one of these signals to be output from multiplexer U16. This selection is accomplished through use of an input selection device (not shown) which causes control means 50 to generate signals D0, D1, D21, and CS60 which are input to multiplexer U16. At least one of these signals causes multiplexer U16 to output the desired PCM input signal in response to the operator's selection. This output signal is shown as the DATA signal, and corresponds to the first signal as shown in FIG. 2.

In accordance with the invention, the input means preferably includes input buffer means for inputting the first signal and outputting the preliminary signal to the filter means. The input buffer means preferably includes subtracter means for subtracting an offset correction signal from the first signal.

Figure 5:
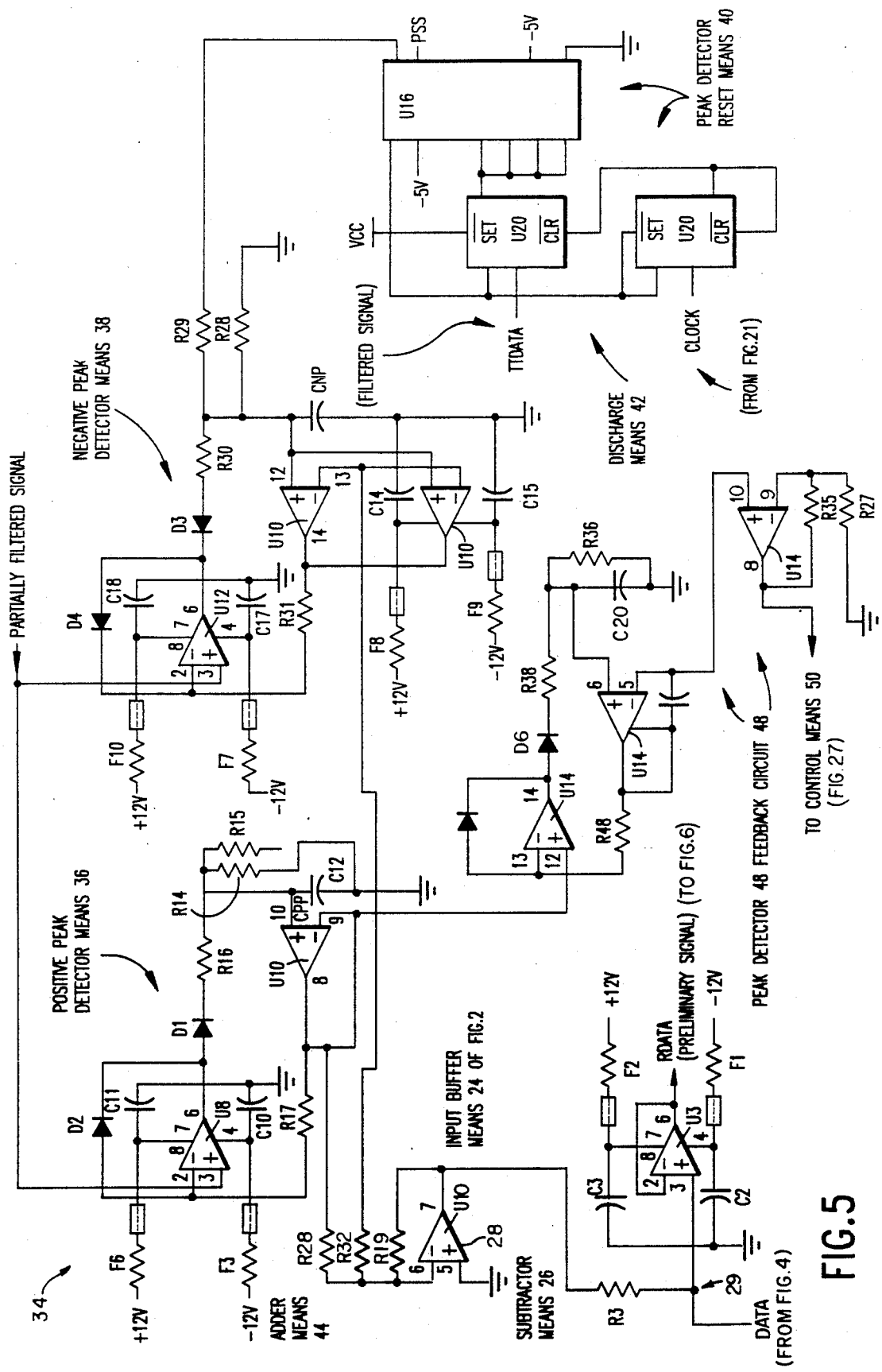
FIG. 5 shows a preferred embodiment of the input buffer means of FIG. 2, and the AC offset means of FIGS. 2 and 10.

FIG. 2 illustrates a preferred embodiment wherein input means 20 includes input buffer means 24, which includes subtracter means 26. Subtracter means 26 combines the first signal from AC coupler means 22 with an offset correction signal and outputs the preliminary signal. As further shown in FIG. 5, the DATA signal, which corresponds to the first signal of FIGS. 2 and 4, is input to operational amplifier U3, which makes up a portion of input buffer means 24. Subtracter means 26 is shown in FIG. 5 as inverter circuit 28, including operational amplifier U10, and addition circuit 29, which combines the output from the operational amplifier U10 with the DATA signal. It is this combined signal which is input to operational amplifier U3 which, in turn, outputs an RDATA signal corresponding to the preliminary signal.

In accordance with the invention, filter means, responsive to a control means, are provided for filtering the preliminary signal and for outputting a filtered signal.

FIG. 1 shows a preferred embodiment wherein filter means 30 inputs the preliminary signal, outputs a filtered signal, and is responsive to control means 50. Filter means 30 also provides control means 50 with a feedback signal.

In accordance with the invention, the filter means preferably includes filter element means for filtering the preliminary signal and for outputting a partially filtered signal. The filter element means preferably includes a filter circuit comprising a multi-channel analog multiplexer; resistor elements each having two leads, a first lead of each resistor being connected to a channel of the multiplexer, and a second lead of each resistor being attached together at a first node point; and a variable capacitor having two leads, a first lead of the variable capacitor being attached to the first node point and a second lead of the variable capacitor being adapted to receive a control input.

Figure 6:
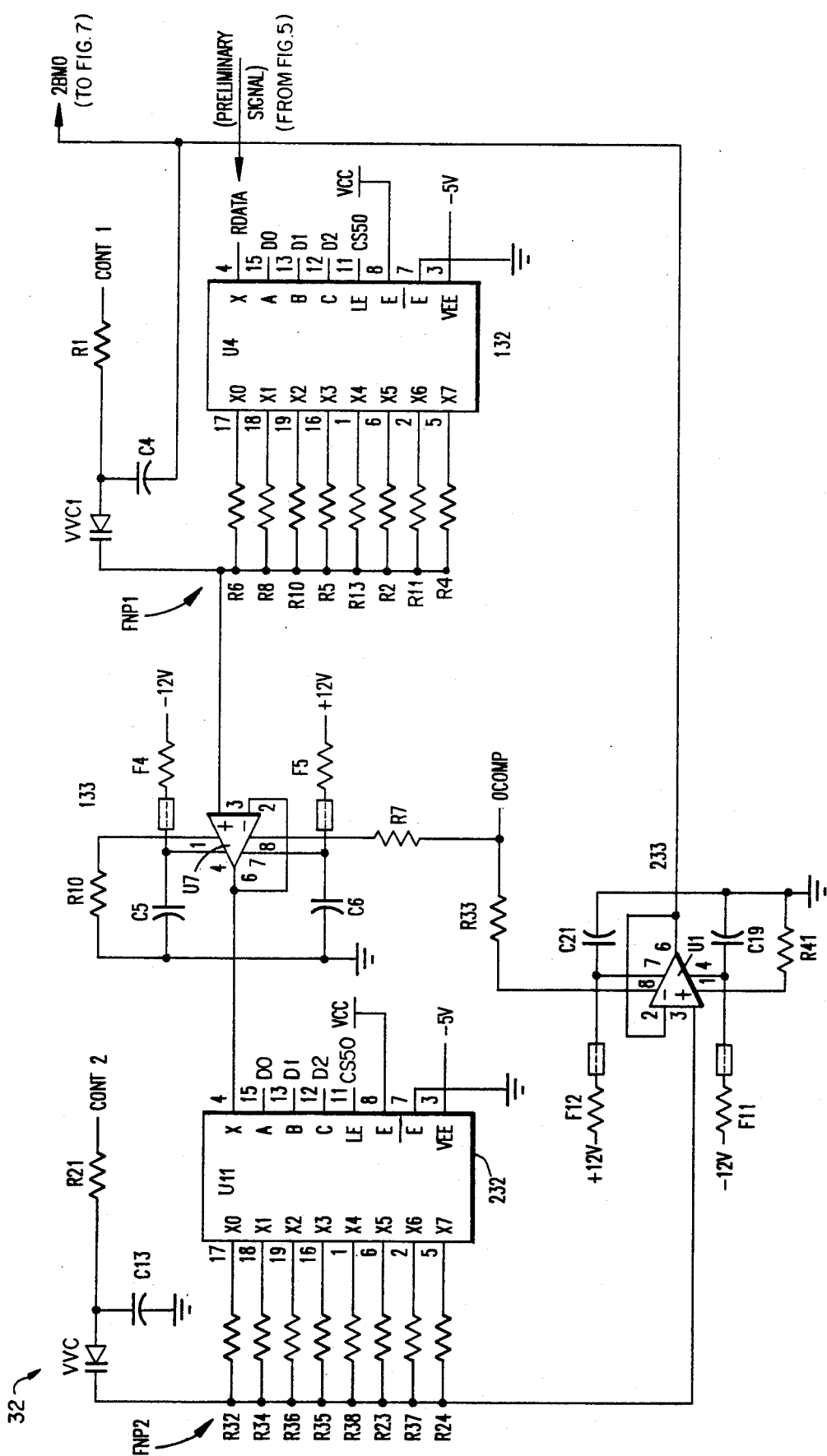
FIG. 6 shows a preferred embodiment of a portion of the filter element means of FIG. 2.

FIG. 2 illustrates a preferred embodiment wherein filter means 30 includes filter element means 32 for inputting the preliminary signal and outputting the partially filtered signal. FIG. 6 shows filter element means 32 as including filter circuit 132. Filter circuit 132 includes multiplexer U4, which inputs the RDATA (preliminary) signal. Connected to channel ports X0-X7 of multiplexer U4 are resistor elements R6, R8, R10, R5, R13, R2, R11, and R4. Whereas one lead of each resistor element is connected to multiplexer U4, the other leads are commonly connected at first node point FNP1. Also attached to first node point FNP1 is a first lead of variable capacitor VVC1. The second lead of variable capacitor VVC1 is adapted to receive a control input CONT1 (indirectly) from control means 50.

In accordance with the invention, the filter element means preferably further includes a plurality of filter circuits; and first buffer means for connecting the first node point of a first filter circuit to the multiplexer of a second filter circuit.

FIG. 6 shows a preferred embodiment wherein filter element means 32 includes first filter circuit 132 and second filter circuit 232. First buffer means 133 connects first node point FNP1 of first filter circuit 132 to multiplexer U11 of second filter circuit 232.

In accordance with the invention, the filter element means preferably further includes second buffer means for connecting the first node point of the second filter circuit to both the multiplexer of a third filter circuit and the second lead of the variable capacitor of the first filter circuit.

Figure 7:
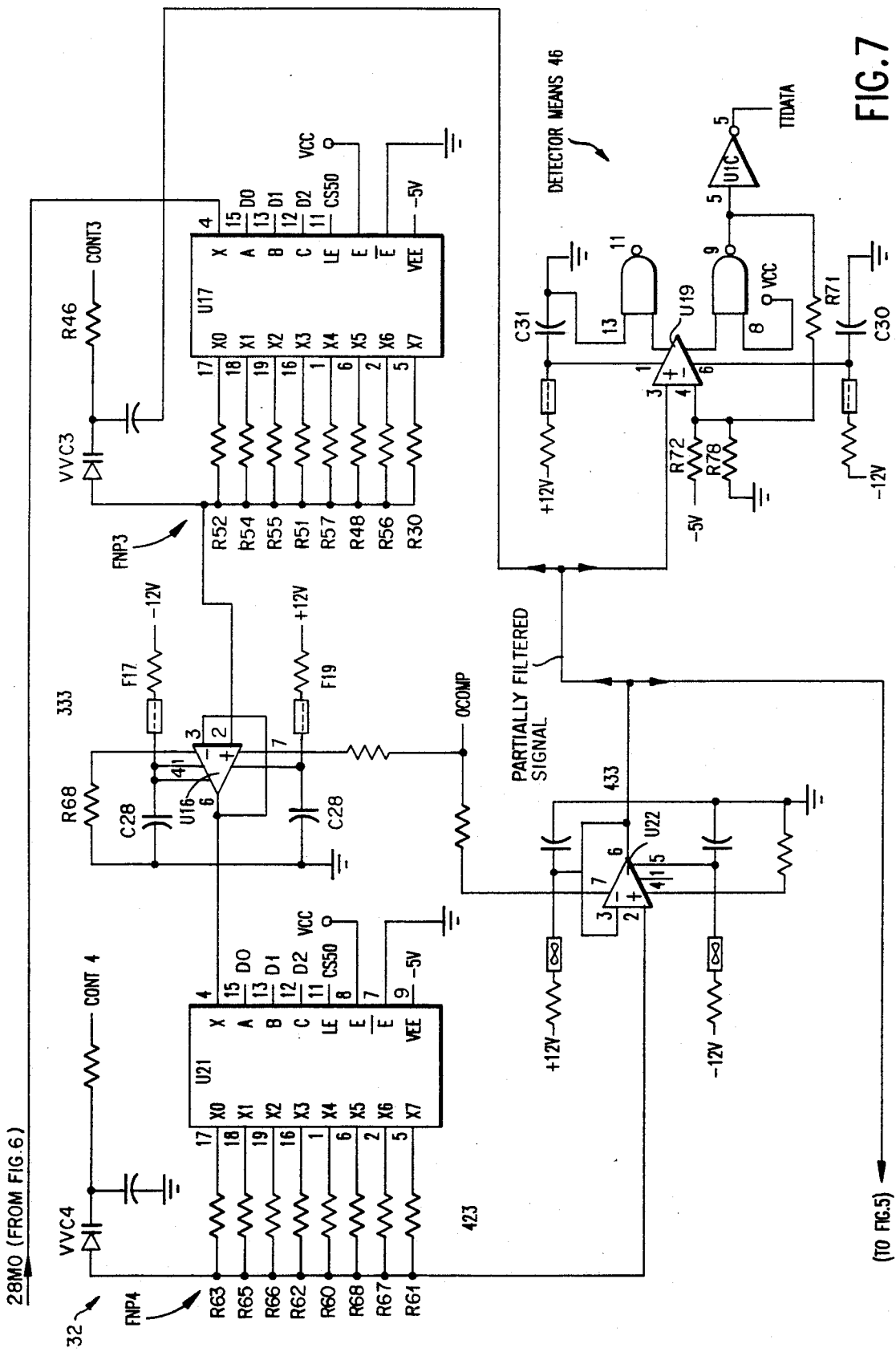
FIG. 7 shows a preferred embodiment of another portion of the filter element means of FIG. 2 and the detector means of FIG. 2.

FIG. 6 shows a preferred embodiment wherein filter element means 32 includes second buffer means 233 which connects first node point FNP2 of second filter circuit 232 to the second lead of variable capacitor VVC1 of first filter circuit 132. FIG. 7 shows a preferred embodiment of filter element means 32 including third filter circuit 332. The output from second buffer means 233 (labeled 2BMO) is input into multiplexer U17 of third filter circuit 332.

In accordance with the invention, the filter element means preferably further includes third buffer means for connecting the first node point of the third filter circuit to the multiplexer of a fourth filter circuit.

FIG. 7 shows a preferred embodiment of filter element means 32 including fourth filter circuit 432. Third buffer means 333 connects first node point FNP3 of third filter circuit 332 with multiplexer U21 of fourth filter circuit 432.

In accordance with the invention, the filter element means preferably further includes fourth buffer means for connecting the first node point of the fourth filter circuit to the second lead of the variable capacitor of the third filter circuit.

FIG. 7 shows a preferred embodiment of filter element means 32 including fourth buffer means 433. Fourth buffer means 433 connects the output of first node point FNP4 of fourth filter circuit 432 to the second lead of variable capacitor VVC3 of third filter circuit 332. The output from fourth buffer means 433 is the partially filtered signal as shown in FIG. 2.

In accordance with the invention, the filter means preferably includes offset compensation means for compensating for the offset caused by the buffer means of the filter element means.

Figure 8:
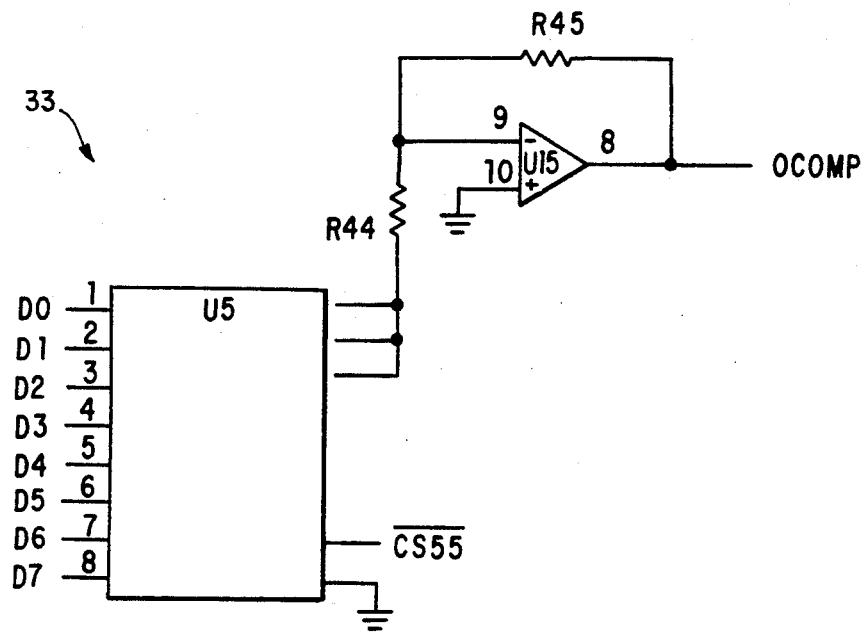
FIG. 8 shows a preferred embodiment of a circuit for generating a compensation signal for the filter element means.

FIG. 8 shows a preferred embodiment wherein offset compensation means 33 outputs an OCOMP signal in response to inputs from control means 50, as described below in reference with FIG. 31. As can be seen in FIG. 6 and FIG. 7, this OCOMP signal is input into the operational amplifiers of all four buffer means 133, 233, 333, and 433.

Figure 9:
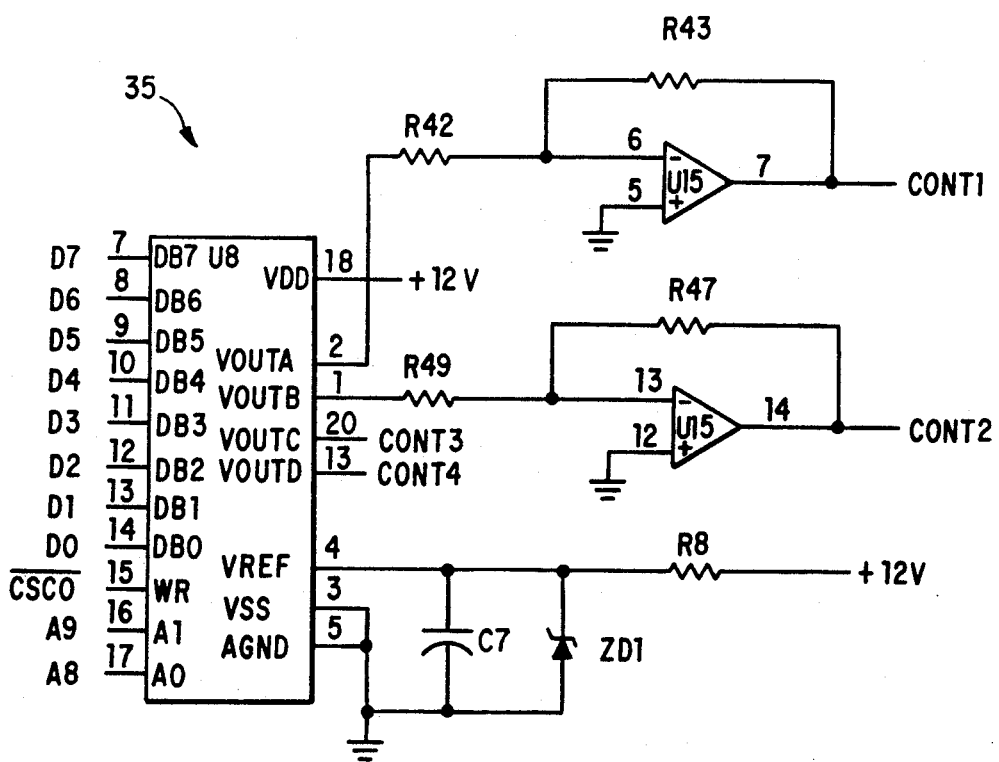
FIG. 9 shows a preferred embodiment of a control circuit for generating control signals for the filter element means.

FIG. 9 shows a preferred circuit 35 for generating the control signals to be input into the second leads of the variable capacitors of the four filter circuits of FIGS. 6 and 7. As may be seen with reference to FIGS. 6, 7, and 9, control signal CONT1 is input into VVC1 of the first filter circuit, CONT2 is input into VVC2 of the second filter circuit, CONT3 is input into VVC3 of the third filter circuit and CONT4 is input into VVC4 of the fourth filter circuit. As shown in FIG. 9, the CONT signals are generated in response to inputs (D0-D7, CSC0, A8, and A9) from control means 50 as described below.

In accordance with the invention, the filter means preferably includes AC offset means for correcting an AC offset of the partially filtered signal, and for outputting the offset correction signal to the subtracter means.

FIG. 2 illustrates a preferred embodiment wherein filter means 30 includes AC offset means 34, which receives the partially filtered signal from filter element means 32 and outputs the offset correction signal to subtracter means 26. AC offset means corrects the AC offset of the partially filtered signal, ensuring that subsequent partially filtered signals have substantially zero AC offset.

In accordance with the invention, the AC offset means preferably includes positive peak detector means, responsive to the partially filtered signal, for detecting and storing a maximum voltage of the partially filtered signal and for outputting a maximum signal.

Figure 10:
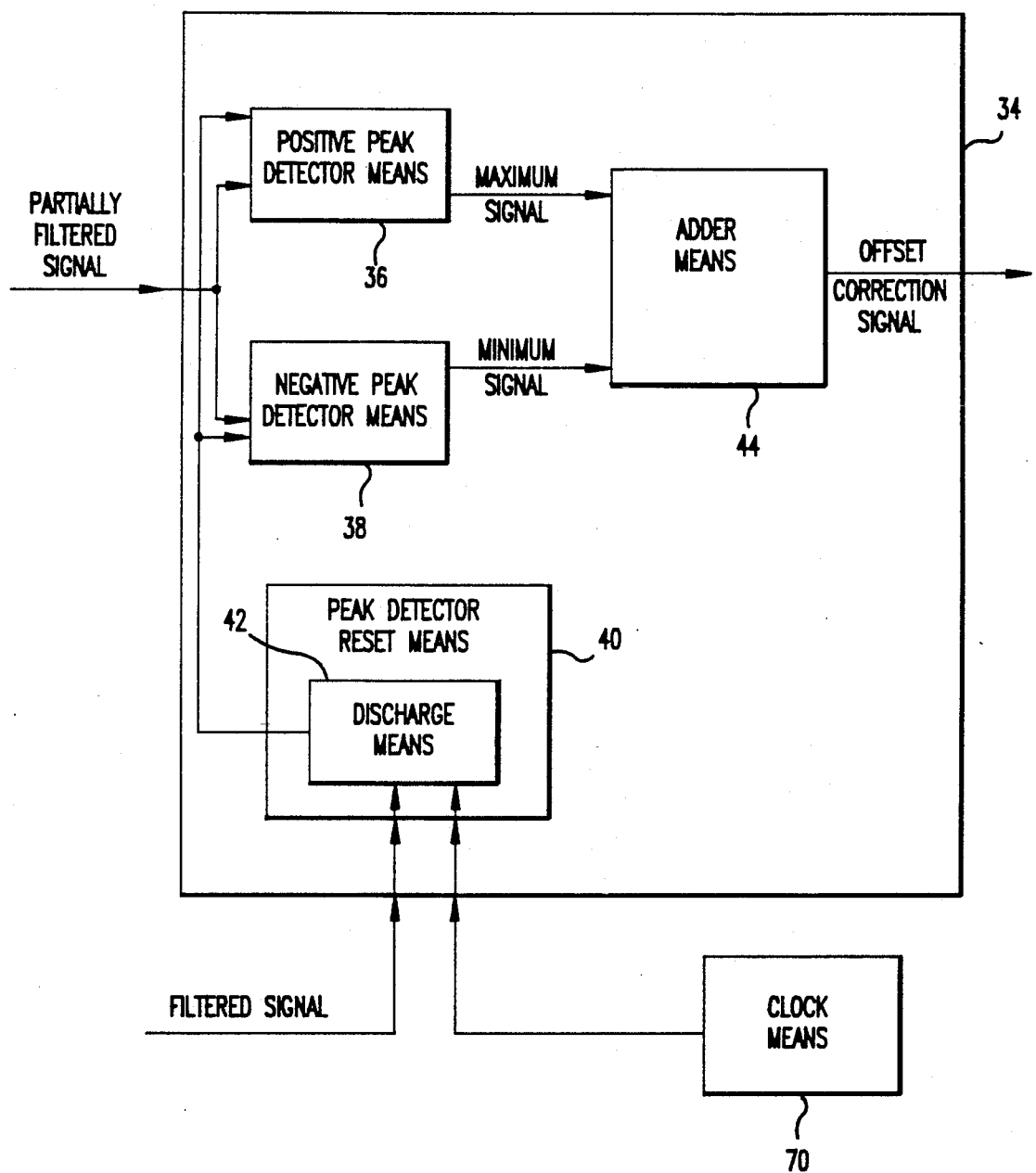
FIG. 10 shows a preferred embodiment of the AC offset means of FIG. 2.

FIG. 10 illustrates a preferred embodiment wherein AC offset means 34 includes positive peak detector means 36 which inputs the partially filtered signal and outputs a maximum signal. FIG. 5 further illustrates a preferred embodiment of positive peak detector means 36.

In accordance with this invention, the AC offset means also preferably includes negative peak detector means, responsive to the partially filtered signal, for detecting and storing a minimum voltage of the partially filtered signal and for outputting a minimum signal.

FIG. 10 shows a preferred embodiment wherein AC offset means 34 includes negative peak detector means 38, which inputs the partially filtered signal and outputs a minimum signal. FIG. 5 further illustrates a preferred embodiment of negative peak detector means 38.

In accordance with the invention, the AC offset means also preferably includes peak detector reset means for resetting the positive and negative peak detector means by causing a discharge of a portion of the voltage stored in the positive and negative peak detector means. The peak detector reset means preferably includes discharge means, responsive to the filtered signal and the clock means, for causing the discharge of the portion of the voltage stored in the positive and negative peak detector means.

FIG. 10 shows a preferred embodiment wherein AC offset means 34 includes peak detector reset means 40, which includes discharge means 42. Discharge means 42 is responsive to the filtered signal and clock means 70 of FIG. 1. FIG. 5 further illustrates a preferred embodiment of peak detector reset means 40 and discharge means 42. The TTDATA signal input to discharge means 42 corresponds to the filtered signal, and the CLOCK signal being input into discharge means 42 corresponds to a signal from clock means 70. The TTDATA signal and the CLOCK signal cause peak detector reset means 40 to effect the discharge of approximately 10% of the storage charge of storage capacitor CPP of positive peak detector means 36 and storage capacitor CNP of negative peak detector means 38, regardless of the frequency of the PCM input signal. This 10% discharge of the storage capacitors is achieved when the TTDATA signal (the filtered signal, which is a square wave signal) changes from zero to one. Note that the PSS signal output from peak detector reset means 40 is input into positive peak detector means 36 through resistor R15.

In accordance with the invention, the AC offset means preferably includes adder means for adding the minimum signal to the maximum signal and for outputting the offset correction signal.

FIG. 10 shows a preferred embodiment wherein AC offset means 34 includes adder means 44, which adds a minimum signal from negative peak detector means 38, to a maximum signal from positive peak detector means 36, and outputs the offset correction signal. FIG. 5 further illustrates a preferred embodiment of adder means 44, wherein the maximum signal, which travels through resistor R20, is added to the minimum signal, which travels through resistor R22. Once these two signals are added, they are inverted by operational amplifier U10 of inverter circuit 28 of subtracter means 26, and then added to the DATA signal (the first signal) by addition circuit 29 of subtracter means 26 in input buffer means 24. Thus, the addition of the signals traveling through resistors R20 and R22 constitutes the offset correction signal which is output from AC offset means 34.

Figure 11:
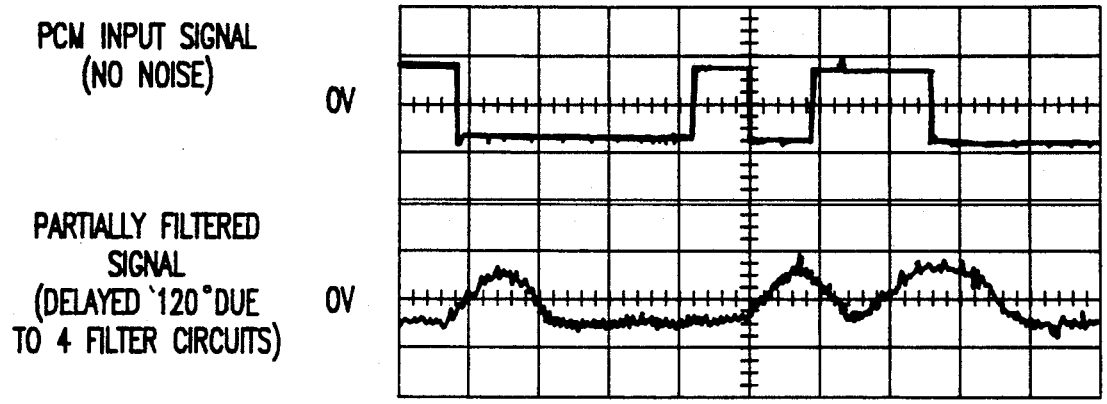
FIG. 11 shows an oscilloscope readout of a PCM input signal having no noise and its corresponding partially filtered signal.
Figure 12:
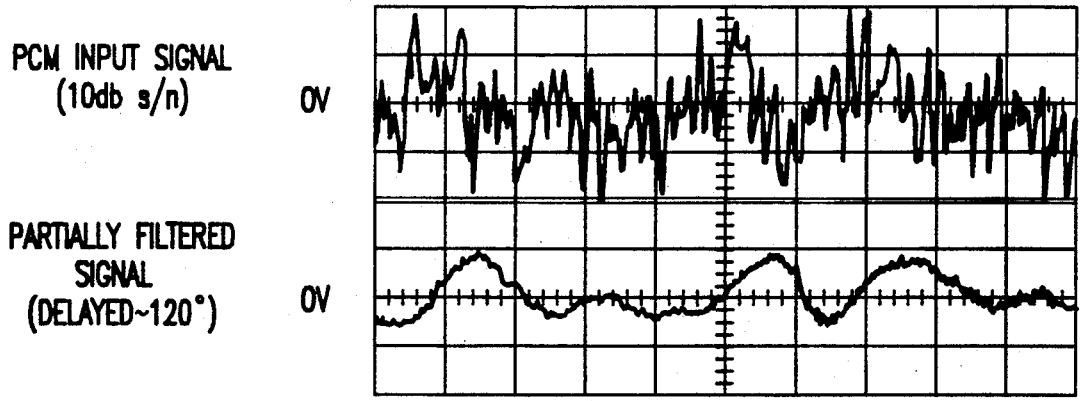
FIG. 12 shows an oscilloscope readout of a PCM input signal having a 10 db signal-to-noise ratio and its corresponding partially filtered signal.

A purpose of AC offset means 34 is to provide for a partially filtered signal that is centered around zero voltage. FIG. 11 illustrates an example of a PCM input signal containing virtually no noise, and the associated partially filtered signal which is delayed approximately 120° due to the four filter circuits. Note that the partially filtered signal is an analog sine-wave-like signal that oscillates around zero voltage. Initially, the partially filtered signal does not necessarily oscillate around zero voltage. To correct for this, the maximum peaks are added to the negative peaks in AC offset means 34, and the resultant sum is constantly subtracted from the first signal in subtracter means 26. This process tends to force subsequent preliminary and partially filtered signals to oscillate around zero voltage, such that their positive peaks equal their negative peaks. This AC offset correction process is continuous throughout the operation of the bit synchronizer. FIG. 12 is similar to FIG. 11, except that the PCM input signal has a 10 db signal-to-noise ratio.

FIG. 5 shows peak detector feedback circuit 48 which detects and stores positive peaks in capacitor C20, much like positive peak detector means 36. Peak detector feedback circuit 48, however, has a fixed discharge time constant established through resistor R36. Since subsequent partially filtered signals should have approximately zero AC offset, the positive peaks should be of equal amplitude to the negative peaks. Based on this knowledge, when the positive peak voltages are input into control means 50, control means 50 assumes that the amplitudes of the positive peaks and the negative peaks are approximately the same. Hence, peak detector feedback circuit 48 provides control means 50 with positive peak information of the partially filtered signal (as may be seen with reference to FIG. 27). With reference to FIG. 1, the output from peak detector feedback circuit 48 of filter means 30 makes up the feedback signal output from filter means 30 which is input to control means 50.

In accordance with the invention, the filter means preferably includes detector means for detecting when the partially filtered signal crosses zero voltage and for outputting a filtered signal.

FIG. 2 shows a preferred embodiment wherein filter means 30 includes detector means 46, which inputs the partially filtered signal and outputs the filtered signal. Detector means 46 is further illustrated in FIG. 7 as a standard zero-crossing detector, which outputs a 5-volt square wave TTDATA (filtered) signal in response to the partially filtered signal. FIG. 11 shows an example of a PCM input signal containing virtually no noise and the associated partially filtered signal. FIG. 12 shows a PCM input signal having a 10 db signal-to-noise ratio and its associated partially filtered signal. The partially filtered signal is an analog, sine-wave-like signal which is input to operational amplifier U19 of detector means 46 as shown in FIG. 7. When the partially filtered signal rises to above zero volts, detector means 46 outputs a steady 5-volt signal. The output from detector means 46 remains at 5 volts until the partially filtered signal drops to below zero volts, at which time detector means 46 outputs a zero voltage TTDATA (filtered) signal. Hence, the TTDATA signal output from detector means 46 as the filtered signal is in the form of a clean 5-volt square wave.

Figure 13:
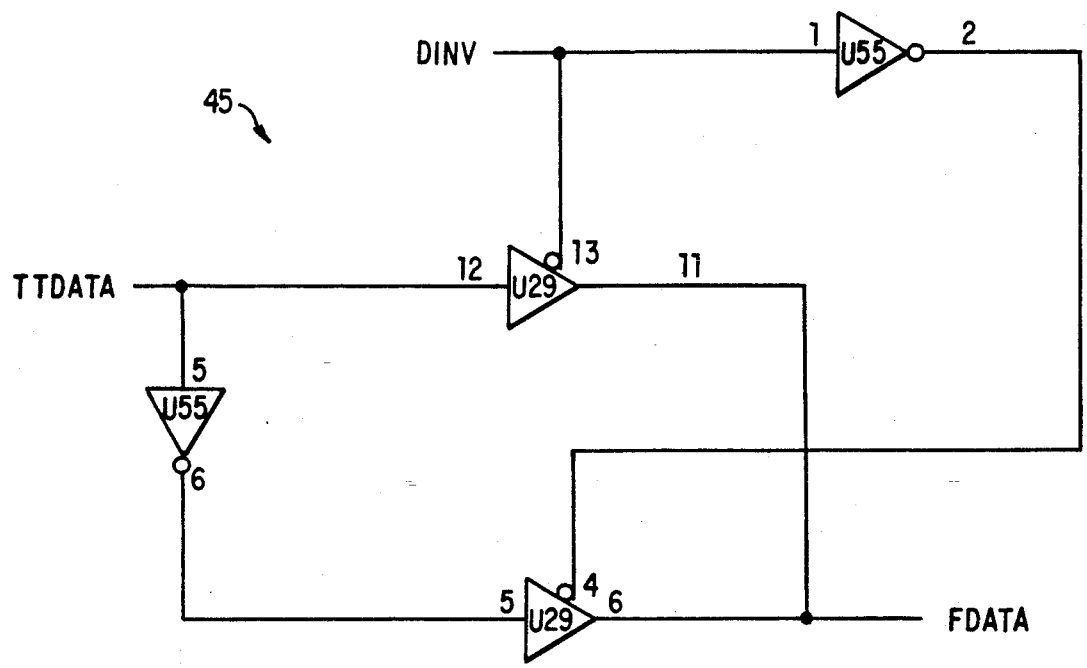
FIG. 13 shows a preferred embodiment of an optional inverter circuit.
Figure 14:
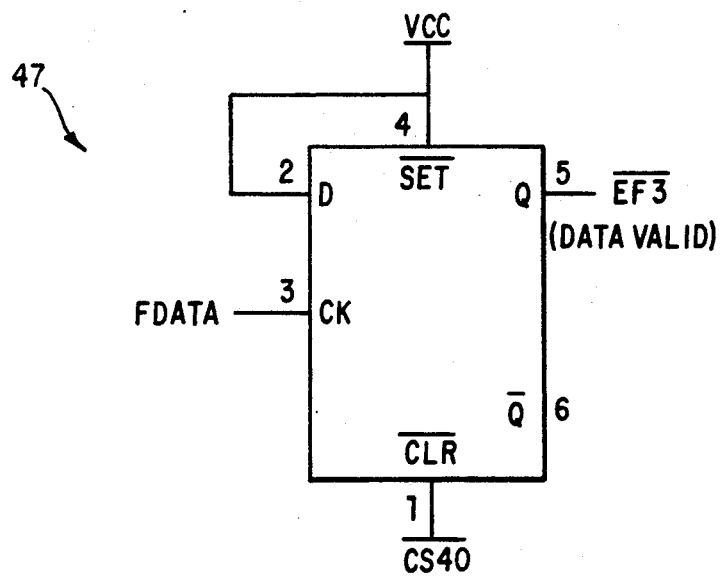
FIG. 14 shows a preferred embodiment of a D-flip flop used to supply the control means with a feedback signal.

In accordance with the invention, the filter means 10 preferably includes an optional inverter circuit for optionally inverting the filtered signal. FIG. 13 shows a preferred embodiment illustrating optional inverter circuit 45, which inputs the TTDATA signal and outputs an FDATA signal in response to a DINV signal from control means 50. The DINV signal is in response to user requirements which will cause the FDATA signal to either be identical to the TTDATA signal or an inversion of the TTDATA signal. Hence, future reference to the filtered signal will correspond to the FDATA signal. As shown in FIG. 1, the filtered signal is input to control means 50, in addition to being input elsewhere. FIG. 14 shows a preferred embodiment of DATA VALID circuit 47, for inputting the FDATA signal and outputting a DATA VALID signal to be input to control means 50.

In accordance with the invention, code converter means, responsive to the control means and a clock means, are provided for converting the filtered signal and for outputting an output data signal having a second predetermined code format.

FIG. 1 shows a preferred embodiment wherein code converter means 60 inputs the filtered signal and outputs the output data signal in response to clock means 70 and control means 50.

In accordance with the invention, the code converter means preferably includes a Miller decoder having Miller outputs; a Bi-Phase decoder having Bi-Phase outputs; an NRZ decoder having NRZ outputs; and data multiplexer means, responsive to an input code format signal from the control means, the Miller outputs, the Bi-Phase outputs, and the NRZ outputs, for outputting the output data signal.

Figure 15A:
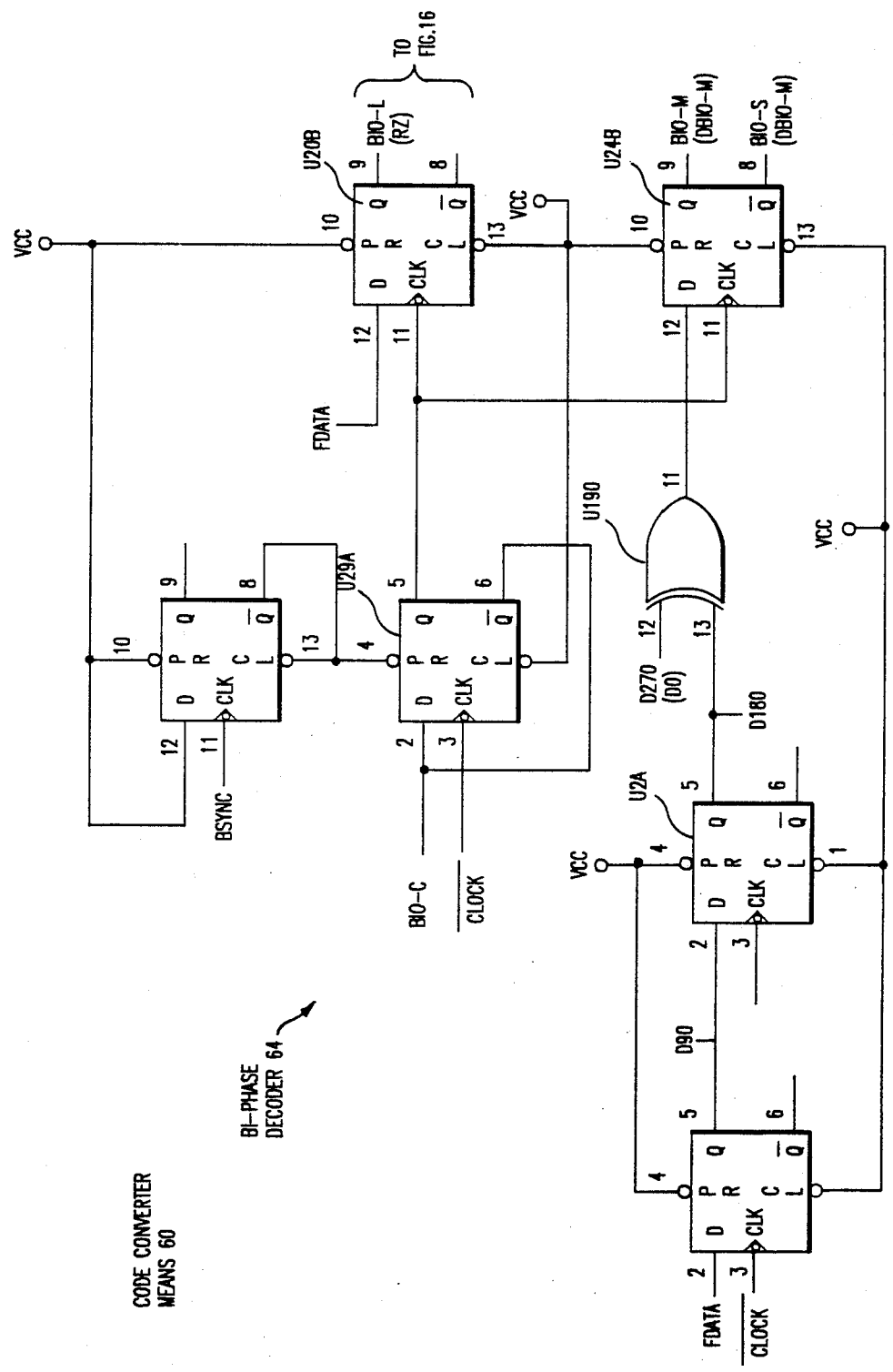
FIG. 15 shows a preferred embodiment of three decoders of the code converter means of FIG. 1.
Figures 15B, 15C:
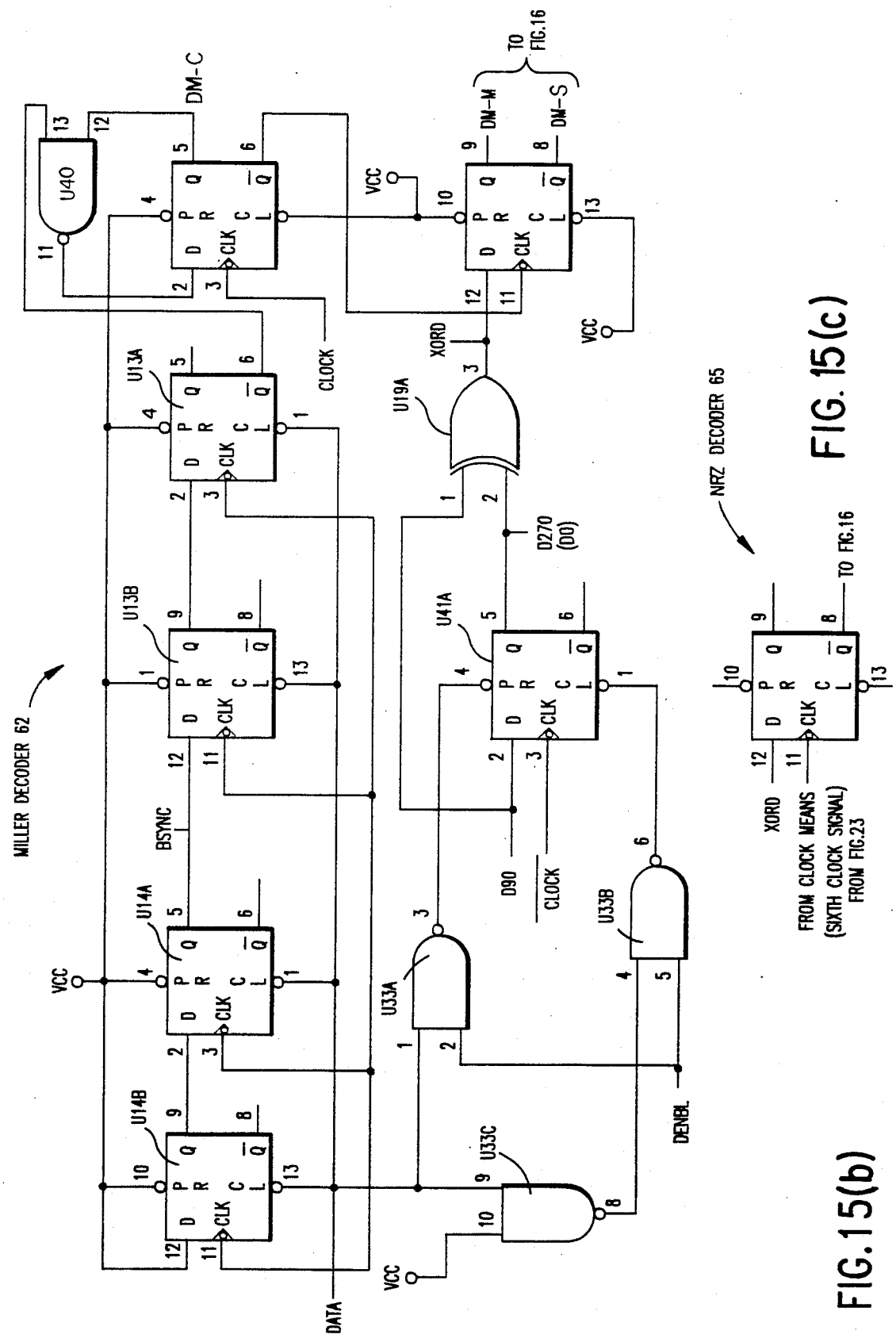

FIG. 15 shows a preferred embodiment wherein code converter means 60 includes a Miller decoder 62 having Miller outputs DM-M and DM-S; a Bi-Phase decoder 64 having Bi-Phase outputs BI0-L (RZ), BI0-M (DBI0-S), and BI0-S (DBI0-M); and an NRZ decoder 65 having NRZ outputs NRZ-M AND NRZ-S. Miller decoders, Bi-Phase decoders, and NRZ decoders are well known in the art, and will not be discussed in detail.

Figure 16:
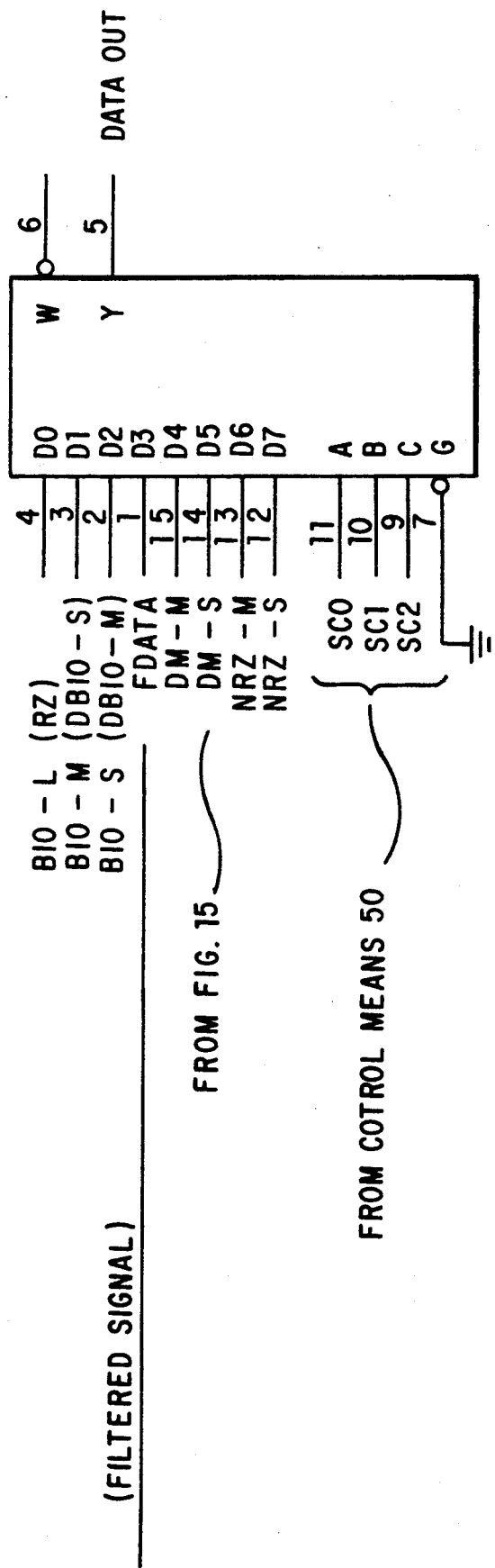
FIG. 16 shows a preferred embodiment of a data multiplexer means of the code converter means of FIG. 1.

FIG. 16 shows a preferred embodiment of code converter means 60 which includes data multiplexer means 66, which inputs the Miller outputs, the Bi-Phase outputs, the NRZ outputs, and the FDATA (filtered) signal. Also input through control signals SC0, SC1, and SC2, is an input code format signal, indirectly received from control means 50. The input code format signal indicates a format of the PCM input signal, and is preferably entered into control means 50 by the operator through a keyboard or similar means.

In the presently preferred embodiment, the second predetermined code format of the output data signal is always the NRZ-L format, and code converter means 60 is designed accordingly. The output from code converter means 60 will always be in the NRZ-L format, regardless of the format of the PCM input signal. Therefore, all that data multiplexer means 66 needs to know is from which decoder output to select, since all decoders of code converter means 60 are operational regardless of the type of PCM input signal code format presented.

The Miller outputs, the Bi-Phase outputs, and the NRZ outputs are labelled according to the input signal format that was decoded in the respective decoder. For instance, the BI0-L output would be the proper output to select if the input signal was in the Bi-Phase-L format. The BI0-L output is an NRZ-L output for a PCM input signal having a Bi-Phase-L format. The NRZ-M output is an NRZ-L output for a PCM input signal having a NRZ-M format. Thus, if the PCM input signal code format was initially an NRZ-L formatted signal, the FDATA (filtered signal) input would be selected and output as the DATA OUT signal. If the input signal was Bi-Phase-L, the BI0-L (RZ) input signal to multiplexer 66 would be selected and output as the DATA OUT signal. The input code format signal from control means 50 informs data multiplexer means 66 from which input to select in order to output the correct DATA OUT signal. This DATA OUT signal corresponds to the output data signal.

In accordance with the invention, the code converter means preferably includes a Miller decoder having Miller outputs; a Bi-Phase decoder having Bi-Phase outputs; an NRZ decoder having NRZ outputs; data multiplexer means, responsive to an input code format signal from the control means, the Miller outputs, the Bi-Phase outputs, and the NRZ outputs, for outputting an initial output signal; and randomizer means, responsive to the clock means and the control means, for selectively adding a waveform to the initial output data signal, and for outputting the output data signal.

Figure 17:
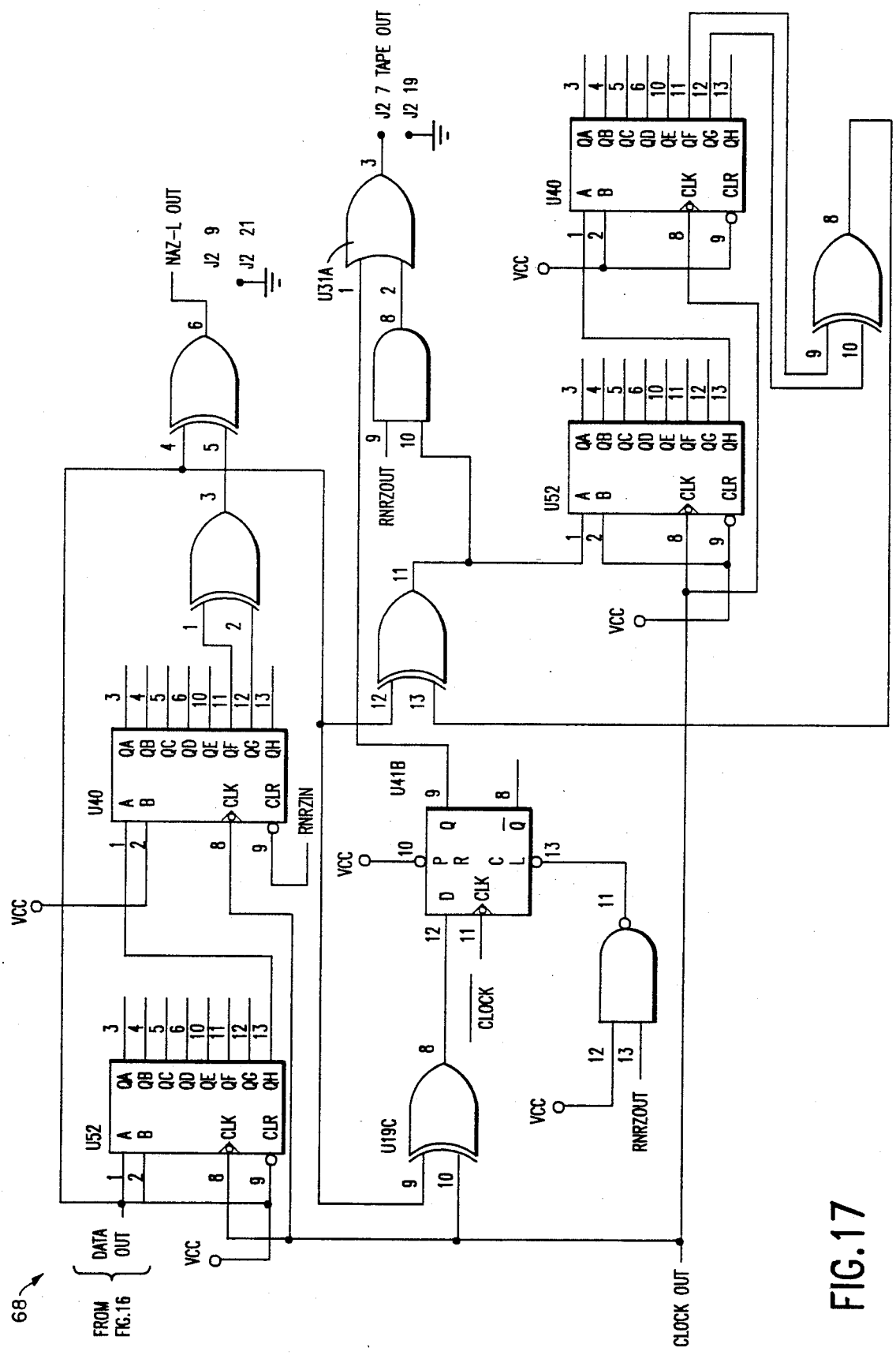
FIG. 17 shows a preferred embodiment of a randomizer means of the code converter means of FIG. 1.

FIG. 17 shows a preferred embodiment wherein code converter means 60 includes randomizer means 68, which is responsive to an RNRZIN and RNRZOUT signal from control means 50, and clock signals (CLOCK and CLOCK OUT) from clock means 70. This preferred embodiment utilizes Miller decoder 62, Bi-Phase decoder 64, and NRZ decoder 65 as shown in FIG. 15, and data multiplexer means 66 shown in FIG. 16.

The output data signal is shown in FIG. 17 as being either or both of the NRZ-L OUT signal and the TAPE OUT signal. The NRZ-L out signal preferably is connected to downstream devices for immediate processing, while the TAPE OUT signal is preferably connected to a tape drive, such that the output data signal may be recorded for subsequent processing.

A purpose of randomizer means 68 is to selectively add a waveform to the initial output data (DATA OUT) signal that is to be output as the TAPE OUT signal for recording purposes. If this TAPE OUT signal is subsequently input as a PCM input signal to input means 20, randomizer means 68 adds the inverse of the waveform to the initial output data (DATA OUT) signal before outputting the output data signal as the NRZ-L OUT signal.

The PCM input signal may contain data having a long period of unchanged data, i.e., the PCM input signal may be at a constant high or low for long periods of time. When this occurs, the component means of the preferred embodiments are unable to update their respective signals. By adding a known waveform to the initial output data signal (DATA OUT) prior to recording the output data signal, when that output data signal is subsequently input as a PCM input signal, it will contain a random, yet known, waveform which will allow the component means of the preferred embodiment to adjust accordingly. When that PCM input signal appears as the DATA OUT signal, randomizer means 68 then subtracts (i.e., adds the inverse of) the random, yet known, waveform from the DATA OUT signal and outputs a clean NRZ-L OUT signal for use by downstream devices.

In a preferred embodiment, the operator may select whether he desires the output data signal to contain the random waveform when the output data signal is to be recorded for subsequent processing. If the output data signal is to be used immediately by downstream devices, and has not previously been subjected to a randomized waveform, the operator may select randomizer means 68 to output the output data signal as NRZ-L OUT which is identical to the initial output data signal. Finally, if the PCM input signal has previously been subjected to a randomized waveform from randomizer means 68, the operator may select that the output data signal be output as NRZ-L OUT as the initial data signal minus the previously added randomized waveform.

In accordance with the invention, clock means, responsive to the filtered signal, the code converter means, and the control means are provided for outputting the output clock signal in a predetermined phase with the output data signal.

FIG. 1 shows a preferred embodiment wherein clock means 70 outputs an output clock signal in response to the filtered signal, an input from code converter means 60, and an input from control means 50.

In accordance with the invention, the clock means preferably includes phase comparator means for comparing the phase of the filtered signal with the phase of a first clock signal, and for outputting a lead/lag signal.

Figure 18:
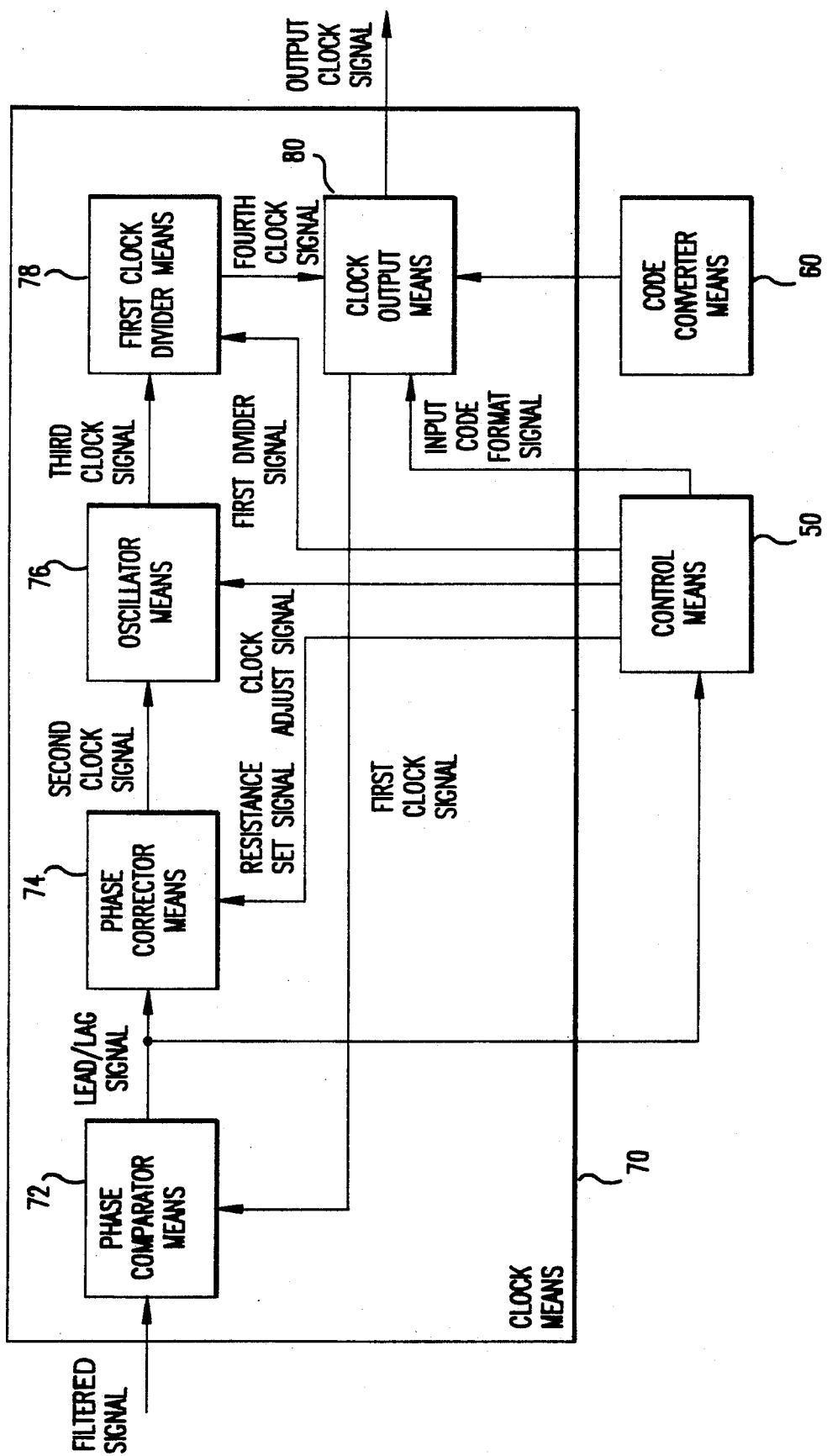
FIG. 18 shows a preferred embodiment of the clock means of FIG. 1.
Figure 19:
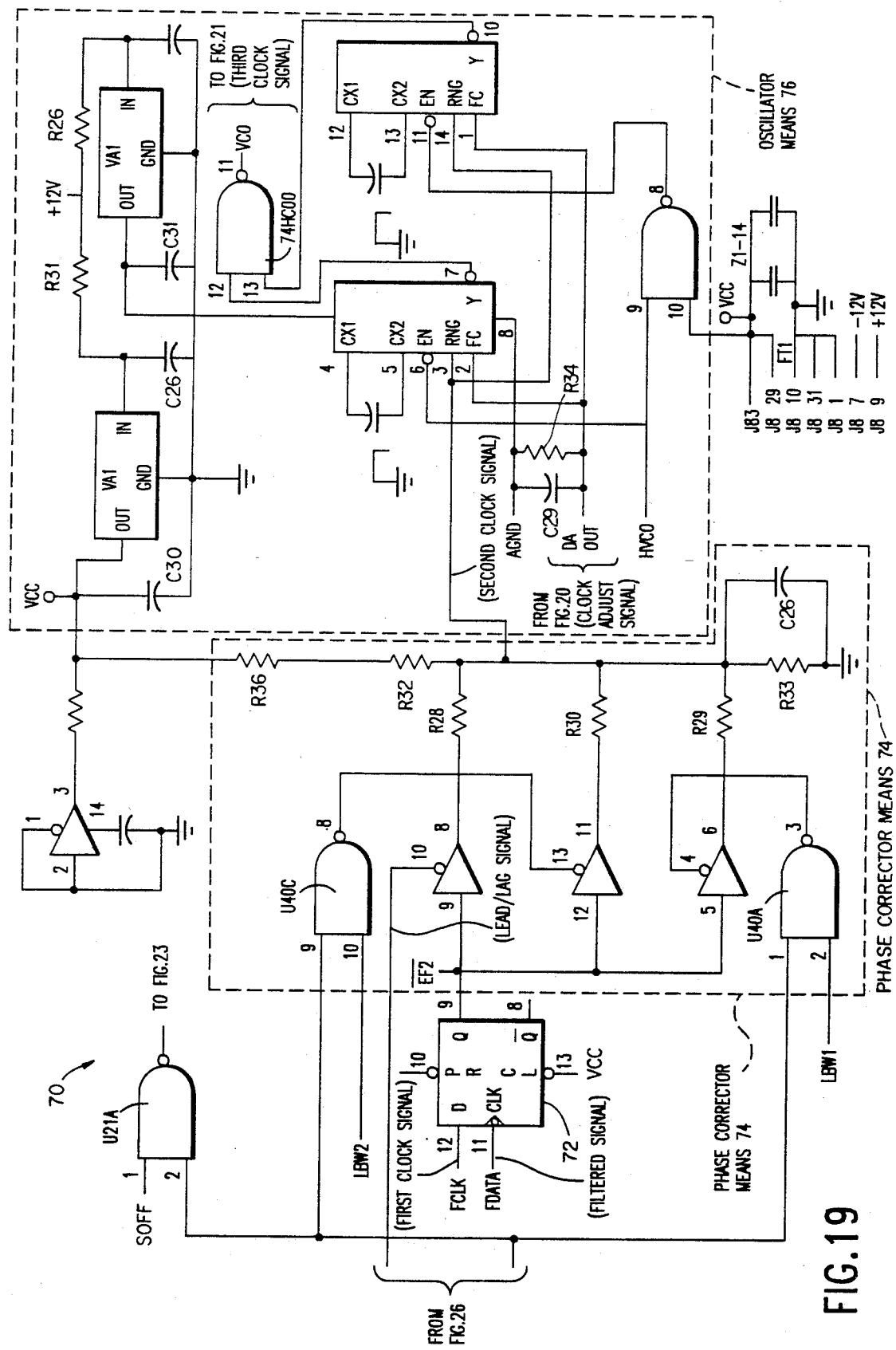
FIG. 19 shows a preferred embodiment of a phase comparator means, a phase corrector means, and an oscillator means of FIG. 18.

FIG. 18 shows a preferred embodiment wherein clock means 70 includes phase comparator means 72 which inputs the filtered signal and a first clock signal and outputs a lead/lag signal. The lead/lag signal indicates whether the first clock signal is leading or lagging the filtered signal. FIG. 19 shows a preferred embodiment of phase comparator means 72 as including D-flip flop U59. The FCLK signal corresponds to the first clock signal, and the FDATA signal corresponds to the filtered signal. The lead/lag signal corresponds to the output of the D-flip flop U59.

In accordance with the invention, the clock means preferably includes phase corrector means, responsive to a resistance set signal from the control means, for adjusting the phase of the lead/lag signal toward the phase of the filtered signal, and for outputting a second clock signal, wherein the control means includes means, responsive to the lead/lag signal, for outputting the resistance set signal and a clock adjust signal.

FIG. 18 shows a preferred embodiment wherein clock means 70 includes phase corrector means 74, which inputs the lead/lag signal and outputs a second clock signal. FIG. 19 shows a preferred embodiment of phase corrector means 74, wherein the signals LBW1 and LBW2 are the resistance set signal from control means 50. As illustrated in FIG. 14, the FDATA signal is input to control means 50 via the DATA VALID signal output from D-flip flop U59. As shown in FIG. 19, the lead/lag signal is input to control means 50 via the connection EF2. By comparing the DATA VALID signal with the lead/lag signal (EF2), control means 50 outputs a resistance set signal to select a combination of resistors R28, R30, and R29 which adjust the phase of the lead/lag signal toward the phase of the FDATA (filtered) signal by a fixed amount (depending upon the combination of resistors selected), at the next FDATA pulse input to phase comparator means 72. In this preferred embodiment, resistor R28 is always selected while resistors R29 and R30 may or may not be selected, depending upon the signals LBW1 and LBW2 received from control means 50. This adjustment process is described below with reference to FIG. 31. This shifted signal is output from phase corrector means 74 as the second clock signal shown in FIG. 18.

In accordance with the invention, the clock means preferably includes oscillator means, responsive to the clock adjust signal and the second clock signal, for outputting a third clock signal.

FIG. 18 shows a preferred embodiment wherein clock means 70 includes oscillator means 76, which inputs the second clock signal and outputs a third clock signal in response to the clock adjust signal from control means 50. FIG. 19 shows a preferred embodiment of oscillator means 76, wherein the clock adjust signal corresponds to the DA OUT signal, and the VCO signal corresponds to the third clock signal.

Figure 20:
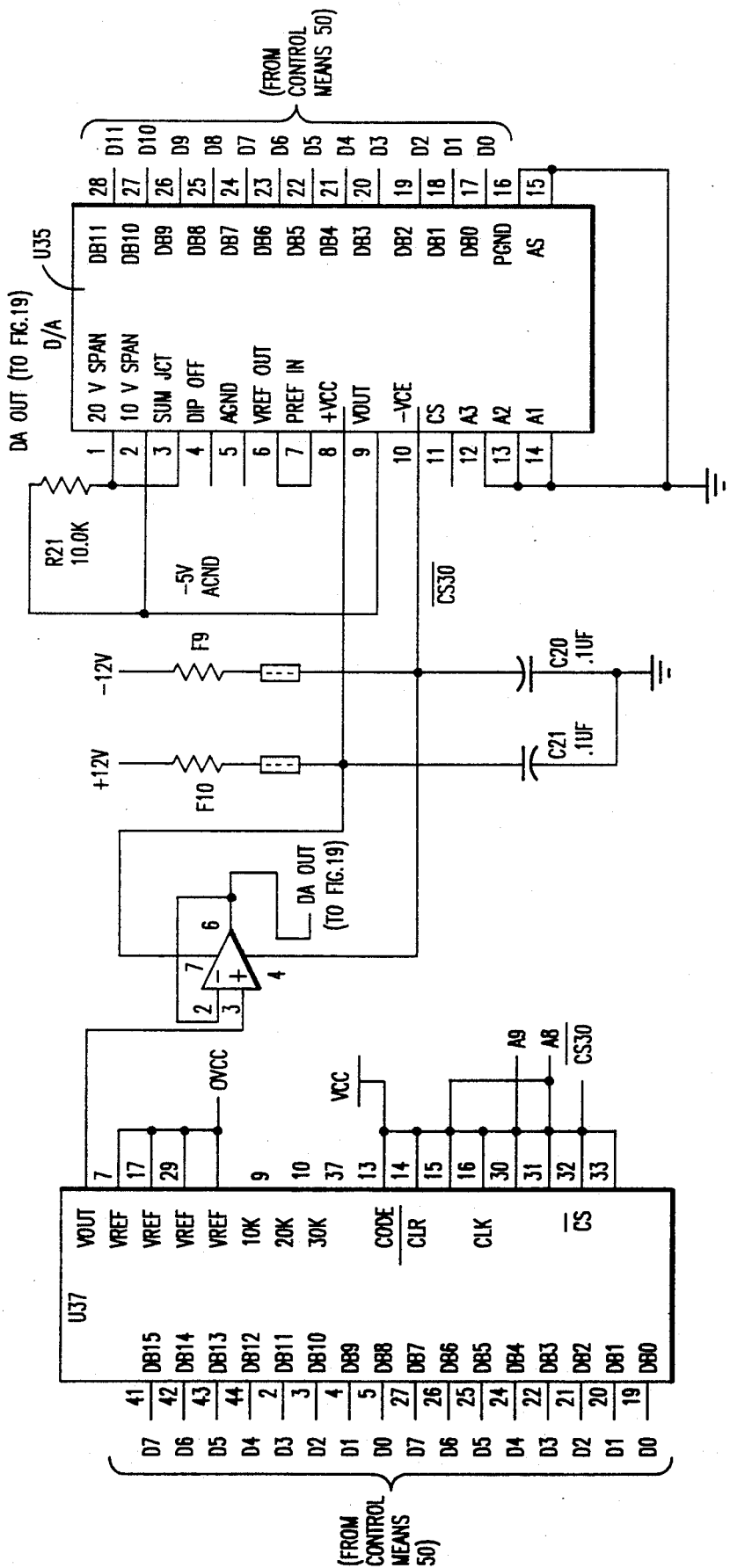
FIG. 20 shows a preferred embodiment of digital-to-analog converters used to increment the voltage supplied to the oscillator means of FIG. 19.

FIG. 20 shows a preferred embodiment of a digital-to-analog converter for outputting the DA OUT signal in response to control means 50. The 16 bit digital-to-analog converter U37 is the preferred digital-to-analog converter, however, it is not readily available in the market. As an alternative, and when the 16 bit digital-to-analog converter is not available, a 12 bit digital-to-analog converter U35 will suffice. The advantage of the 16 bit digital-to-analog converter is that the voltage of the DA OUT signal may be incremented in smaller amounts than with the 12 bit digital-to-analog converter, allowing for a finer adjustment of the frequency of the third clock (VCO) signal output from oscillator means 76.

It is a purpose of oscillator means 76 to input the clock adjust (DA OUT) signal and the second clock signal, and covert the second clock signal into a square wave output signal having a frequency of between approximately 7 MHz-30 MHz. Based on the lead/lag signal (EF2), control means 50 is able to determine whether the first clock (FCLK) signal is either too fast or too slow, and by affecting the output frequency of the VCO (third clock) signal, the frequency of the first clock signal is adjusted accordingly.

In accordance with the invention, the clock means preferably includes first clock divider means, responsive to a first divider signal from the control means, for reducing the frequency of the third clock signal, and for outputting a fourth clock signal.

FIG. 18 shows a preferred embodiment wherein clock means 70 includes first clock divider means 78, which inputs the third clock signal and outputs a fourth clock signal in response to a first divider signal from control means 50.

Figure 21:
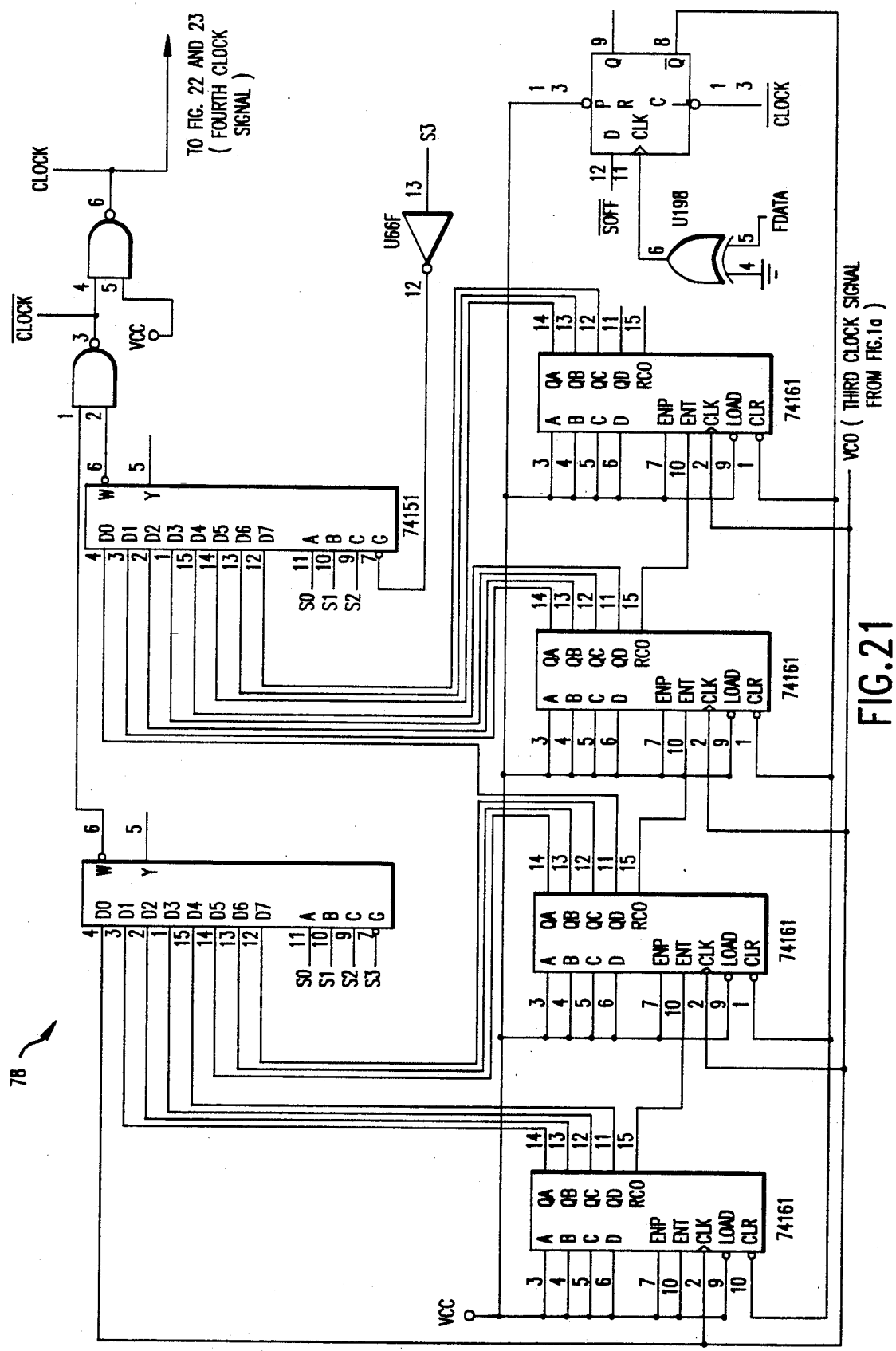
FIG. 21 shows a preferred embodiment of the first clock divider means of FIG. 18.

FIG. 21 shows a preferred embodiment of first clock divider means 78 wherein the VCO signal corresponds to the third clock signal and the CLOCK signal corresponds to the fourth clock signal. The inputs S0, S1, S2, and S3, serve as the first divider signal from control means 50. The first divider signal is preferably only adjusted during the initial set-up of the first clock divider means and is not adjusted during the remaining operation. A discussion of this initial set-up is provided later with reference to FIG. 30.

A purpose of first clock divider means 78 is to reduce the frequency of the VCO (third clock) signal to a frequency compatible with that of the output data signal. A typically preferred frequency range of the CLOCK (fourth clock) signal is from approximately 500 Hz–30 MHz.

In accordance with the invention, the clock means preferably includes clock output means, responsive to the fourth clock signal, an input code format signal from the control means, and the code converter means, for outputting the first clock signal and for outputting the output clock signal.

FIG. 18 shows a preferred embodiment wherein clock means 70 includes clock means 80 for inputting the fourth clock signal and outputting the output clock signal and the first signal in response to an input code format signal from control means 50, and in response to code converter means 60.

In accordance with the invention, the clock output means preferably includes second clock divider means 82 for dividing the fourth clock signal and outputting a fifth clock signal; and clock selector means, responsive to the input code format signal, for selecting between the fourth clock signal and the fifth clock signal to be output as the first clock signal, and for outputting the first clock signal.

Figure 22:
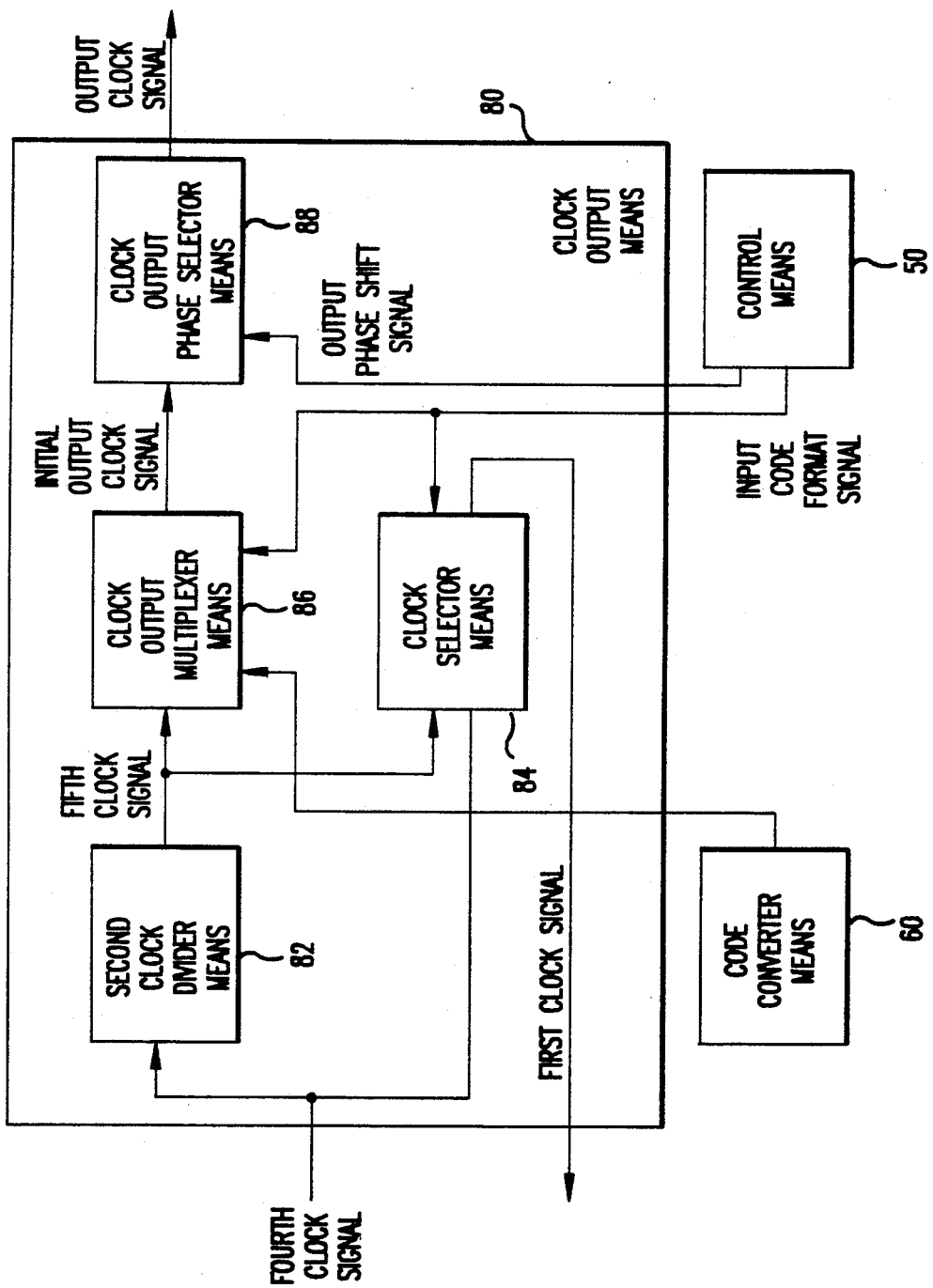
FIG. 22 shows a preferred embodiment of the clock output means of FIG. 18.

FIG. 22 shows a preferred embodiment wherein clock output means 80 includes second clock divider means 82 which inputs the fourth clock signal and outputs a fifth clock signal to clock selector means 84. Clock selector means 84 also inputs the fourth clock signal and, in response to the input code format signal from control means 50, outputs the first clock signal.

Figure 23:
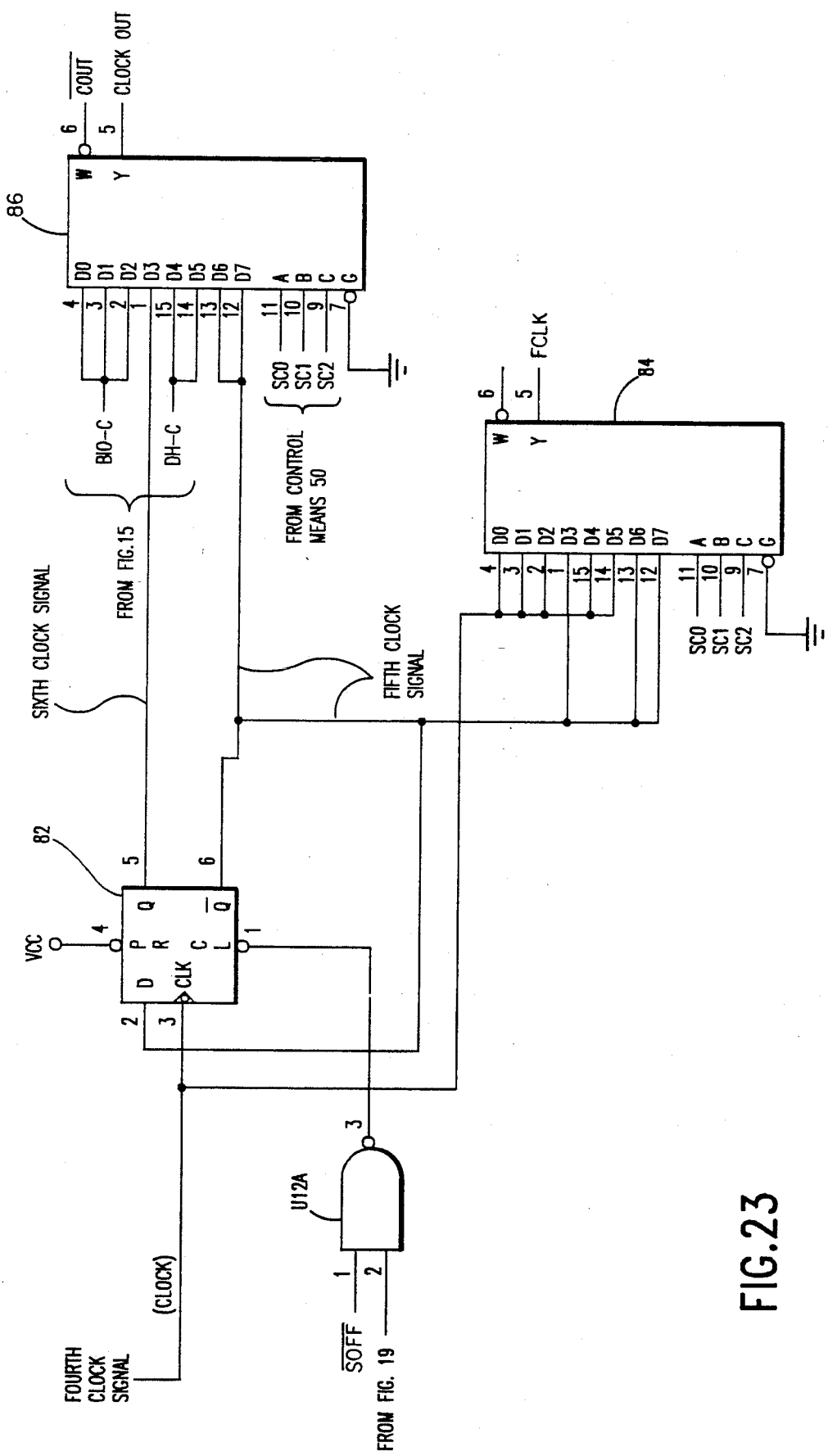
FIG. 23 shows a preferred embodiment of the second clock divider means, the clock output multiplexer means, and the clock selector means of FIG. 22.

FIG. 23 shows a preferred embodiment of clock output means 80 including a preferred embodiment of second clock divider means 82, and a preferred embodiment of clock selector means 84. A purpose of the preferred embodiment of second clock divider means 82 is to divide the fourth clock signal (CLOCK) in half and to output this signal as the fifth clock signal. Clock selector means 84 then chooses between the fourth clock signal and the fifth clock signal to be output as the first clock signal shown as FCLK. Clock selector means 84 selects between the fourth clock signal and the fifth clock signal in response to the input code format signal from control means 50 as shown by the input signals SC0, SC1, and SC2. Hence, depending upon the PCM input signal format which is entered by the operator, clock selector means 84 chooses between the fourth clock signal and the fifth clock signal and outputs the selected signal as the first clock (FCLK) signal.

In accordance with the invention, the clock output means preferably further includes clock output multiplexer means, responsive to the fifth clock signal, the code input format signal, and the code converter means, for outputting the output clock signal.

FIG. 22 shows a preferred embodiment wherein clock output means 80 includes clock output multiplexer means 86, which inputs the fifth clock signal and outputs an initial output clock signal in response to the input code format signal from control means 50, and in response to code converter means 60. In this preferred embodiment, the initial output clock signal of FIG. 22 corresponds to the output clock signal.

FIG. 23 shows a preferred embodiment of clock output multiplexer means 86, wherein the CLOCK OUT signal corresponds to the output clock signal; input signals SC0, SC1, and SC2 correspond to the input code format signal from control means 50; and the input signals BI0-C and DM-C correspond to additional outputs from Bi-Phase decoder 64 and Miller decoder 62 shown in FIG. 15. The BI0-C and DM-C inputs correspond to the input from code converter means 60. Hence, depending upon the input code format signal from control means 50 as initially selected by the operator, the CLOCK OUT signal from clock output multiplexer means 86 may be BI0-C or DM-C from code converter means 60, the fifth clock signal, or a sixth clock signal which is output from port 5 of second clock divider means 82 and input to port D3 of clock output multiplexer means 86.

In accordance with the invention, the clock output means preferably further includes clock output multiplexer means, responsive to the fifth clock signal, the input code format signal, and the code converter means, for outputting an initial output clock signal; and clock output phase selector means, responsive to an output phase shift signal from the control means, for optionally shifting the phase of the initial output clock signal and for outputting the output clock signal.

FIG. 22 shows a preferred embodiment wherein clock output means 80 includes clock output multiplexer means 86, which inputs the fifth clock signal, the input code format signal, and is responsive to code converter means 60, for outputting the initial output clock signal to clock output phase selector means 88. The operator may select that the output clock signal be shifted, preferably in 90° increments. Clock output phase selector means 88 preferably shifts the initial output clock signal by 90° increments in response to an output phase shift signal from control means 50 as selected by the operator, and outputs the output clock signal.

Figure 24:
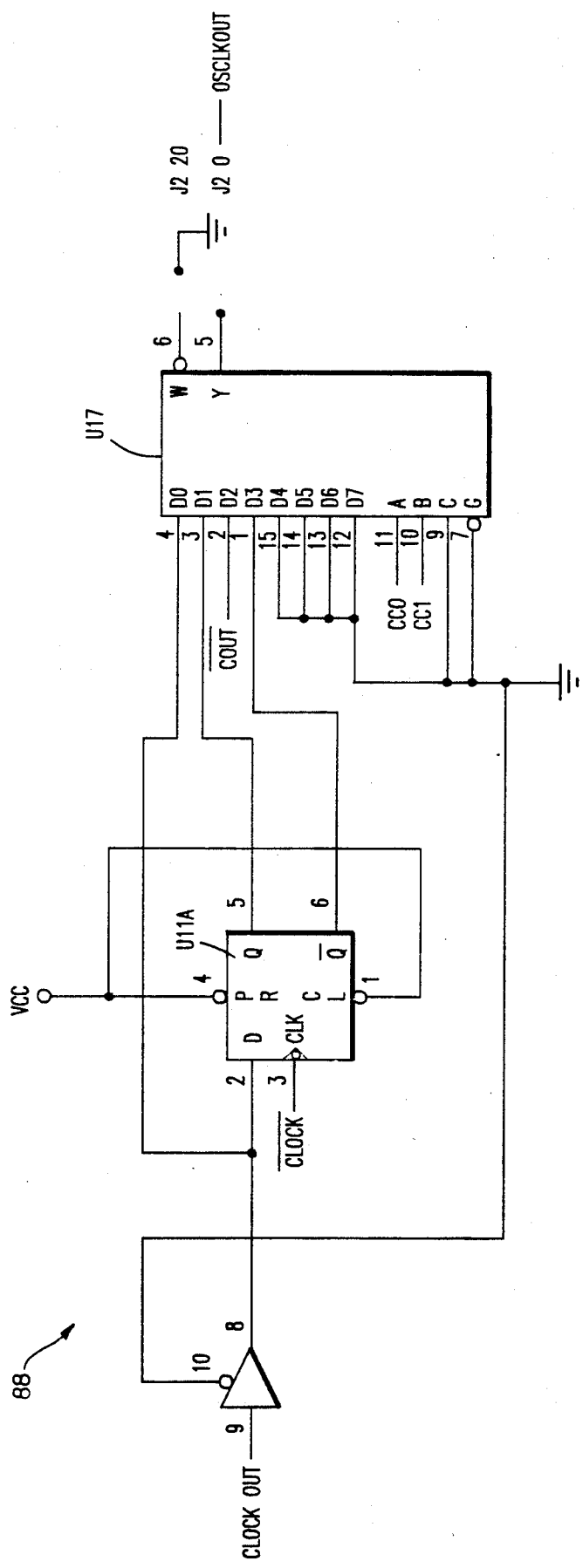
FIG. 24 shows a preferred embodiment of the clock output phase selector means of FIG. 22.

FIG. 24 shows a preferred embodiment of clock output phase selector means 88, wherein the initial output clock signal is shown as the CLOCK OUT signal. Control signals CC0 and CC1 correspond to the output phase shift signal from control means 50. The OSCLK-OUT signal corresponds to the output clock signal. Depending upon the output phase shift signal as set by the operator, the OSCLKOUT signal may be preferably optionally phase shifted in 90° increments from the CLOCK OUT signal.

In accordance with the invention, the apparatus further includes frequency counter means for determining the frequency of a clock signal from the clock means.

Figure 25:
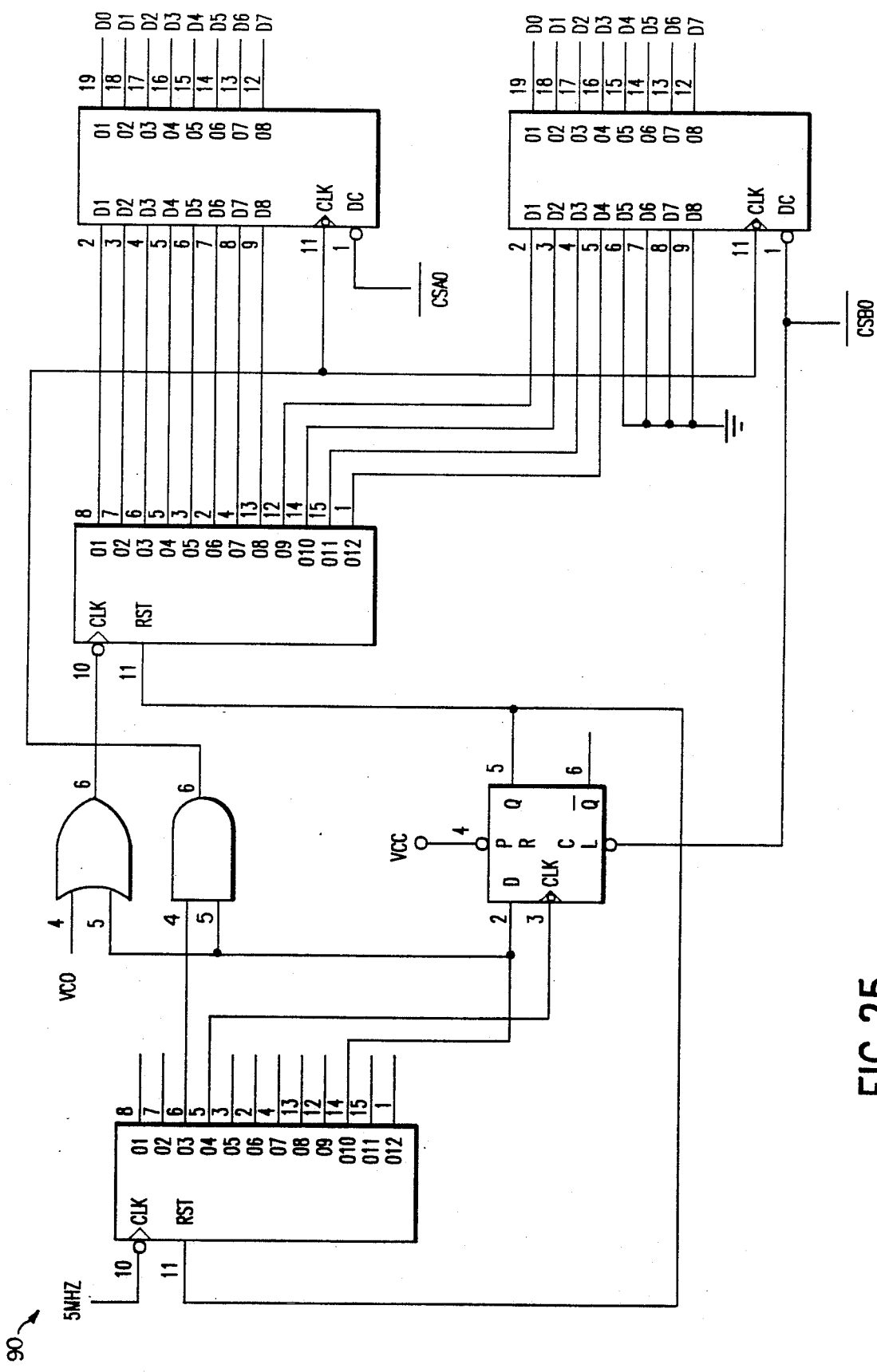
FIG. 25 shows a preferred embodiment of a frequency counter means.

FIG. 25 shows a preferred embodiment of frequency counter means 90 in which the VCO (third signal) signal is determined and output to control means 50, which may then be preferably output to an LED device capable of indicating the frequency of the VCO signal to the operator. Frequency counter means 90 is utilized during initial set-up of first clock divider means 78 shown in FIG. 21, and is discussed below in more detail with reference to FIG. 30.

In accordance with the invention, the apparatus further includes low frequency detecting means for detecting the frequency of the pulse code modulated input signal.

Figure 26:
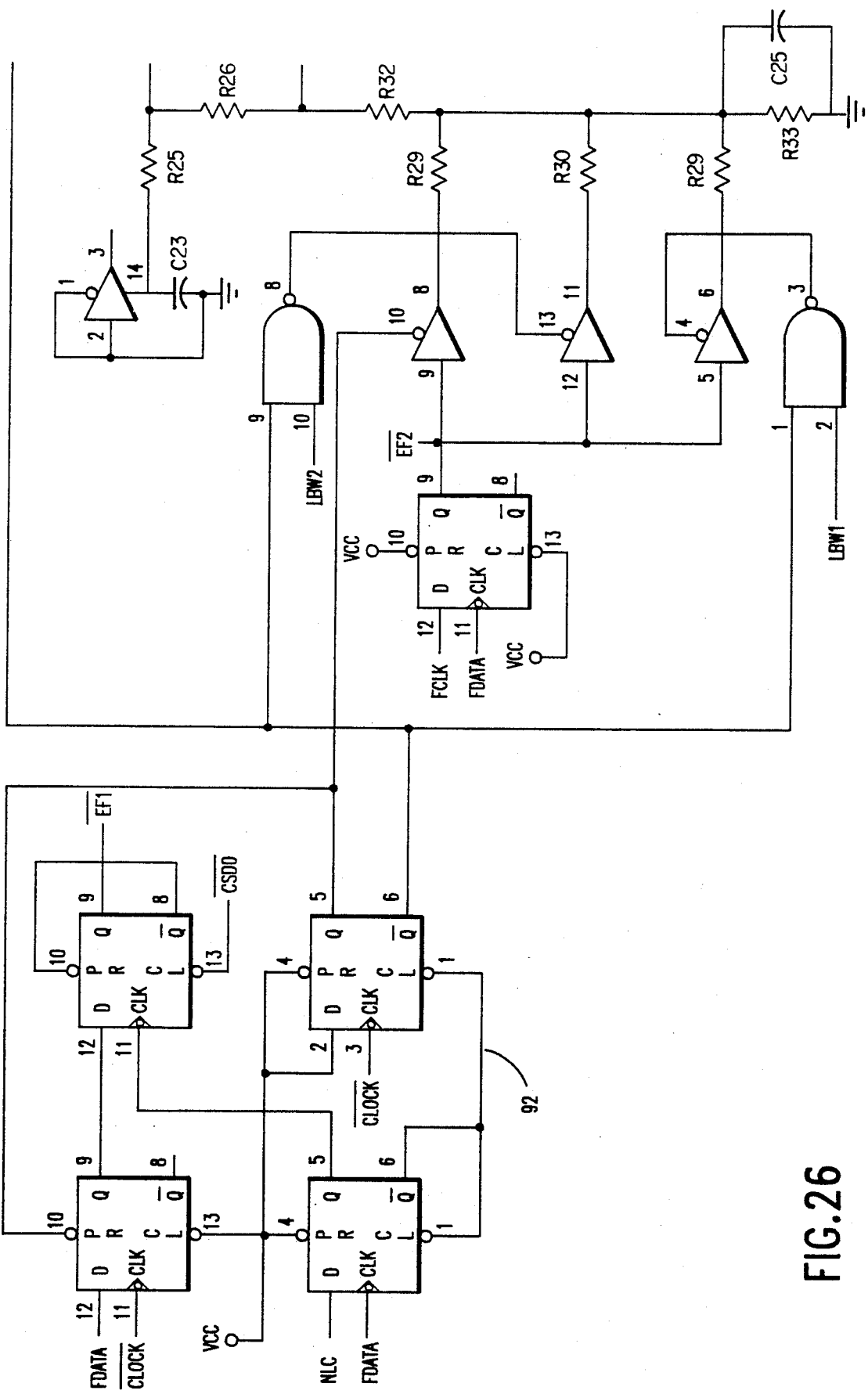
FIG. 26 shows a preferred embodiment of a low frequency detector.

FIG. 26 shows a preferred embodiment wherein low frequency detector means 92 inputs the FDATA (filtered) signal an inverted CLOCK signal, and outputs from control means 50, for detecting the frequency of the pulse code modulated input signal. The output from low frequency detector means 92 is input into control means 50 through signal EF1, and inputs a frequency associated with the frequency of the pulse code modulated input signal, when the operator is unaware of the frequency of the PCM input signal.

B. Control

In accordance with the invention, control means, responsive to user controlled inputs, are provided for digitally controlling the operation of the filter means, the code converting means, and the clock means.

Figure 27A:
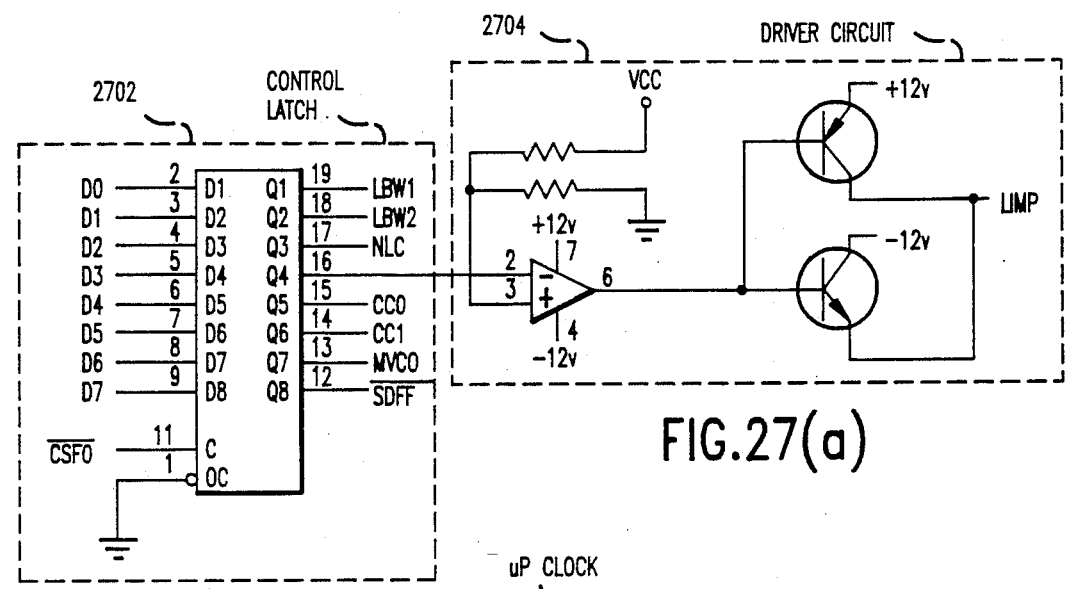
FIG. 27 shows various components of a preferred embodiment of the present invention.
Figure 27B:
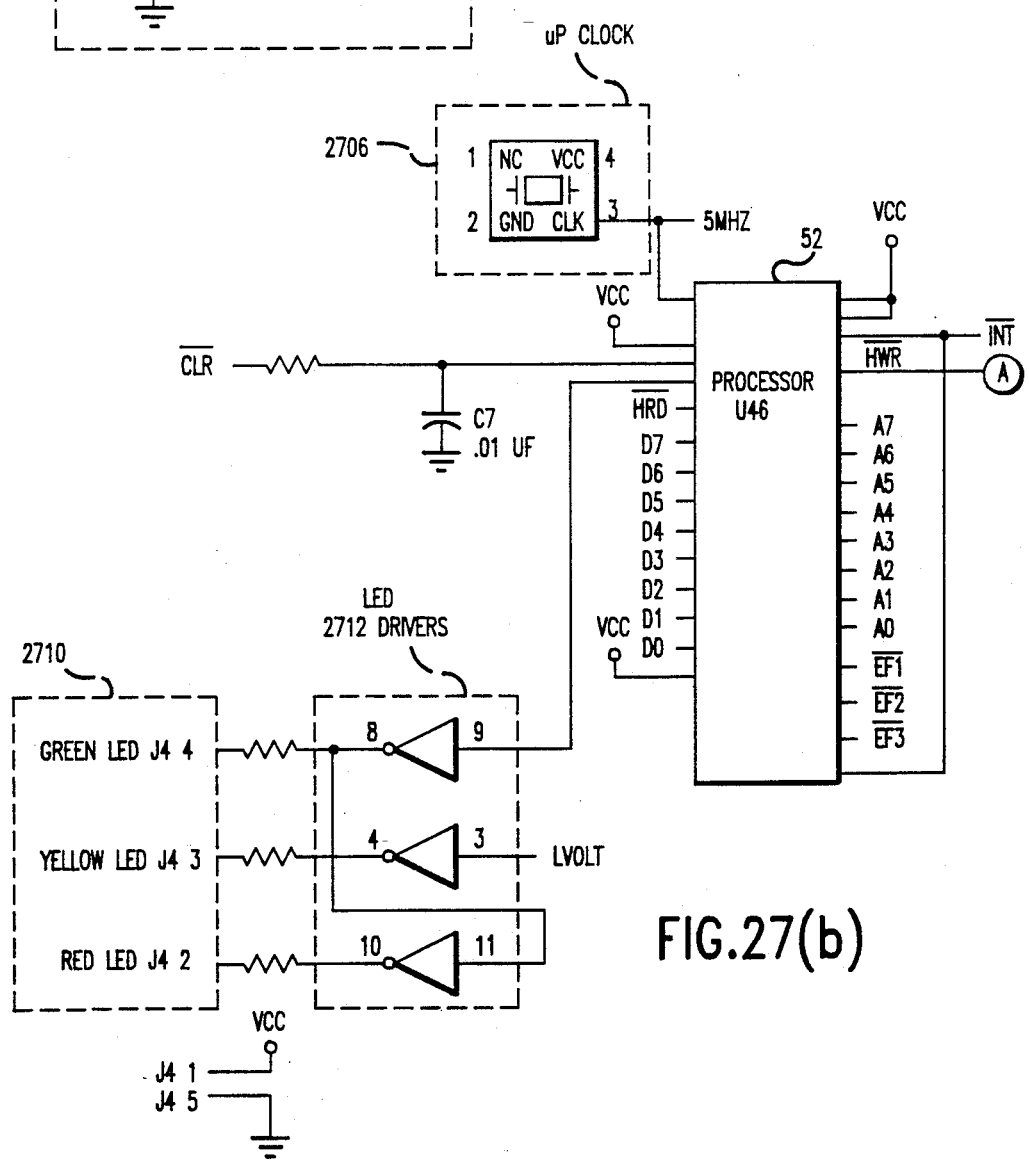
Figures 27C, 27D:
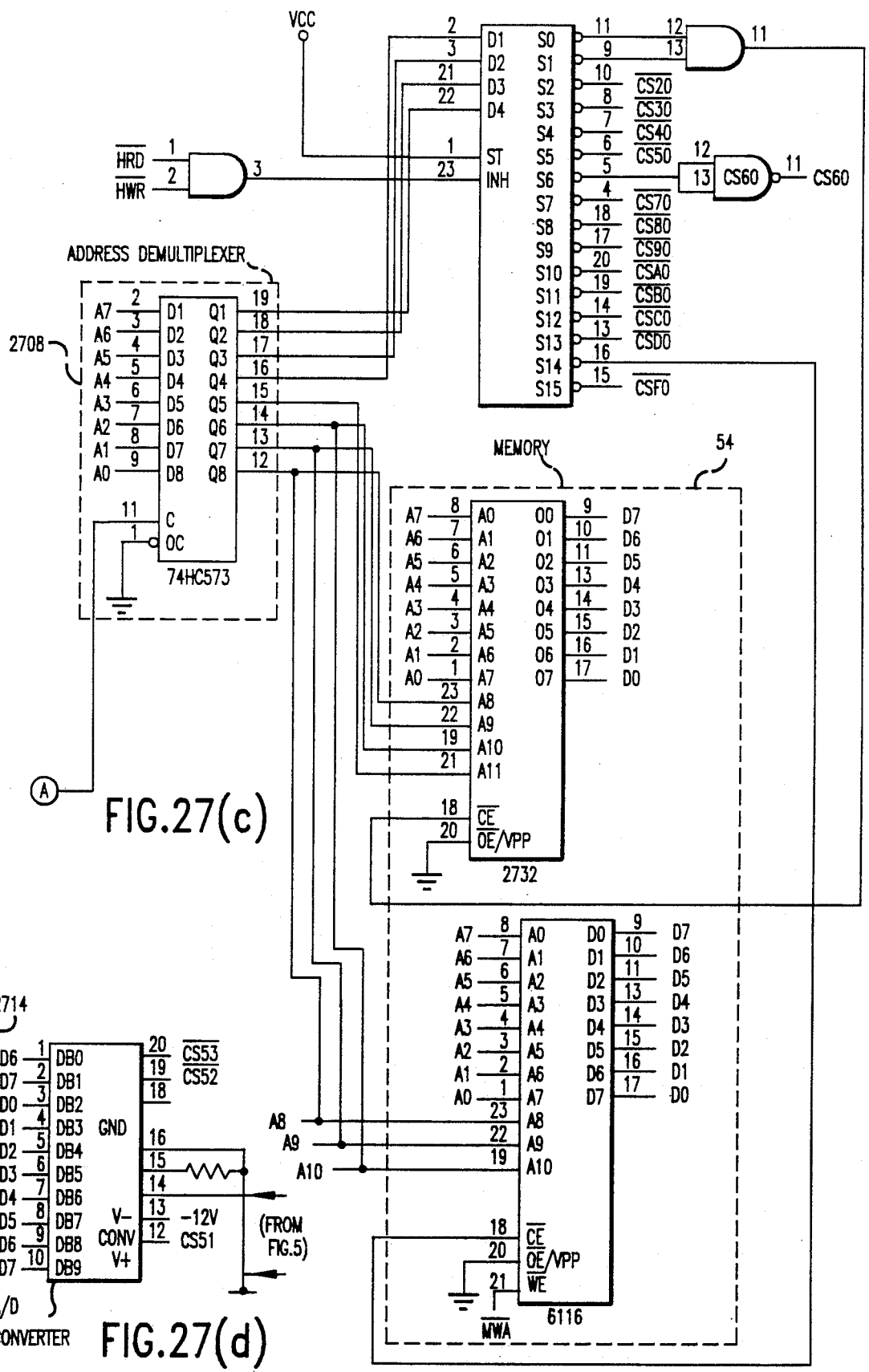

FIG. 27 shows various components of a preferred embodiment of the present invention. FIG. 27 includes a control latch 2702, a driver circuit 2704, a microprocessor clock 2706, an address demultiplexer 2708, light emitting diodes (LEDs) 2710, LED drivers 2712, an A/D converter 2714, a processor 52 and a memory 54. The functions of the components of FIG. 27 are generally understood by persons of ordinary skill in the art and will not be discussed in detail herein.

Figure 28D:
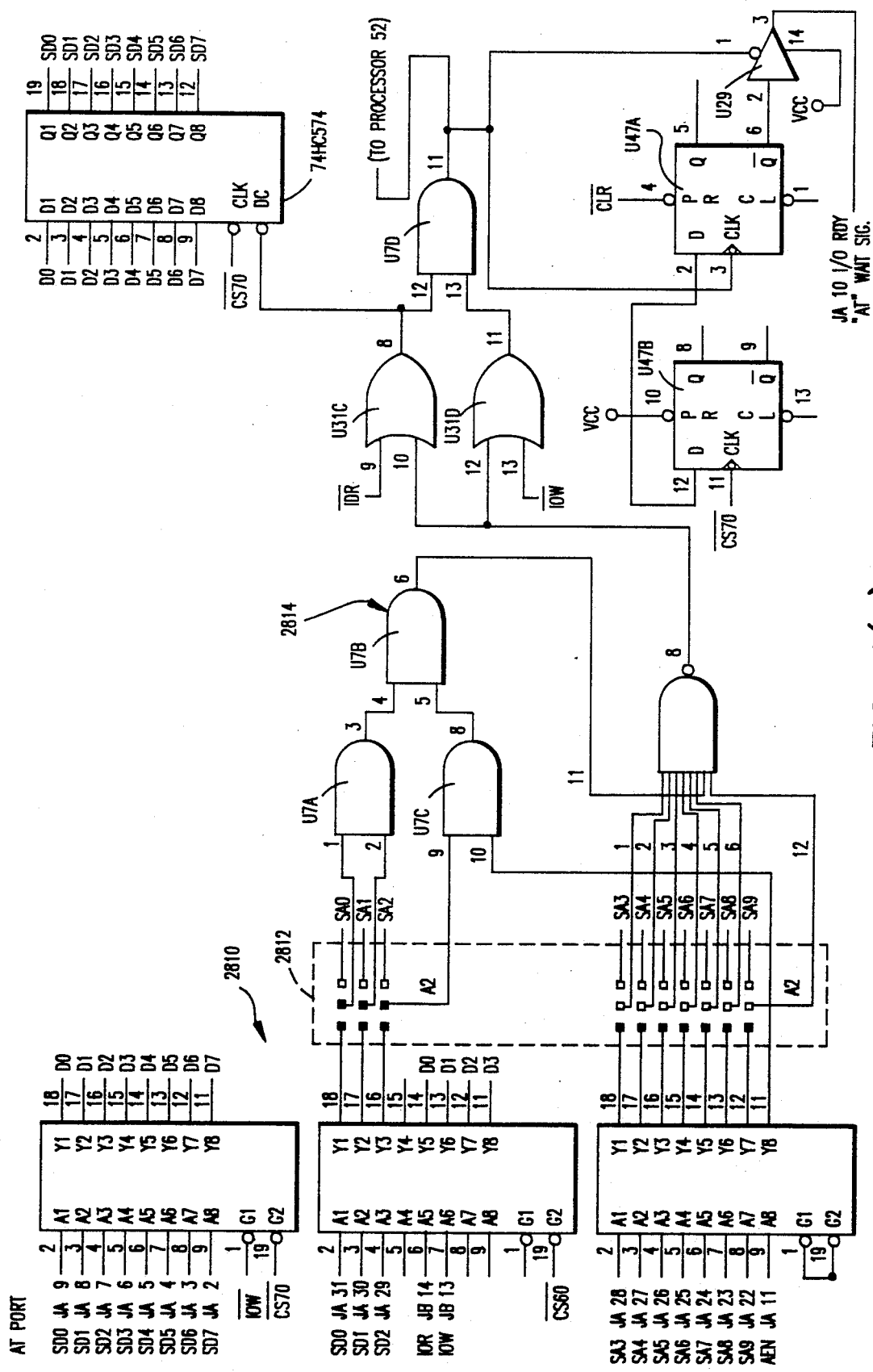
FIG. 28 shows various components of a preferred embodiment of the present invention.

FIG. 28 shows various components of a preferred embodiment of the present invention. FIG. 28 includes a connector 2802, a three-to-eight line decoder 2804, control latches 2806, including a control latch 100, an "AT" port 2808, for connecting the device to a personal computer, connection circuitry 2810, also for connecting the device to a personal computer, I/O port select jumpers 2812, and an I/O decoder 2814. In a preferred embodiment, the personal computer is a PC/AT, manufactured by IBM Corporation. The functions of these components are generally understood by persons of ordinary skill in the art and will not be discussed in detail herein.

FIG. 1 shows a preferred embodiment, wherein control means 50 is responsive to user controlled inputs through a user controlled interface and input/output ports. FIG. 27 shows a preferred embodiment of control means 50, including processor 52 and memory 54, having output control lines including lines CS20, CS30, CS40, CS50, CS60, CS70, CS80, CS90, CSA0, CSB0, CSC0, CSD0, and CSF0. These lines, along with auxiliary circuitry outputting signals on control lines such as CS51, CS52, CS53, CS55, and OCOMP allow control processor 52 to control the components of the device. The following discussion describes how this control is accomplished. Throughout the following discussion, lines shown in the Figures as having the prefix "CS" are understood to be control lines from processor 52.

i) Set-Up

Figure 29:
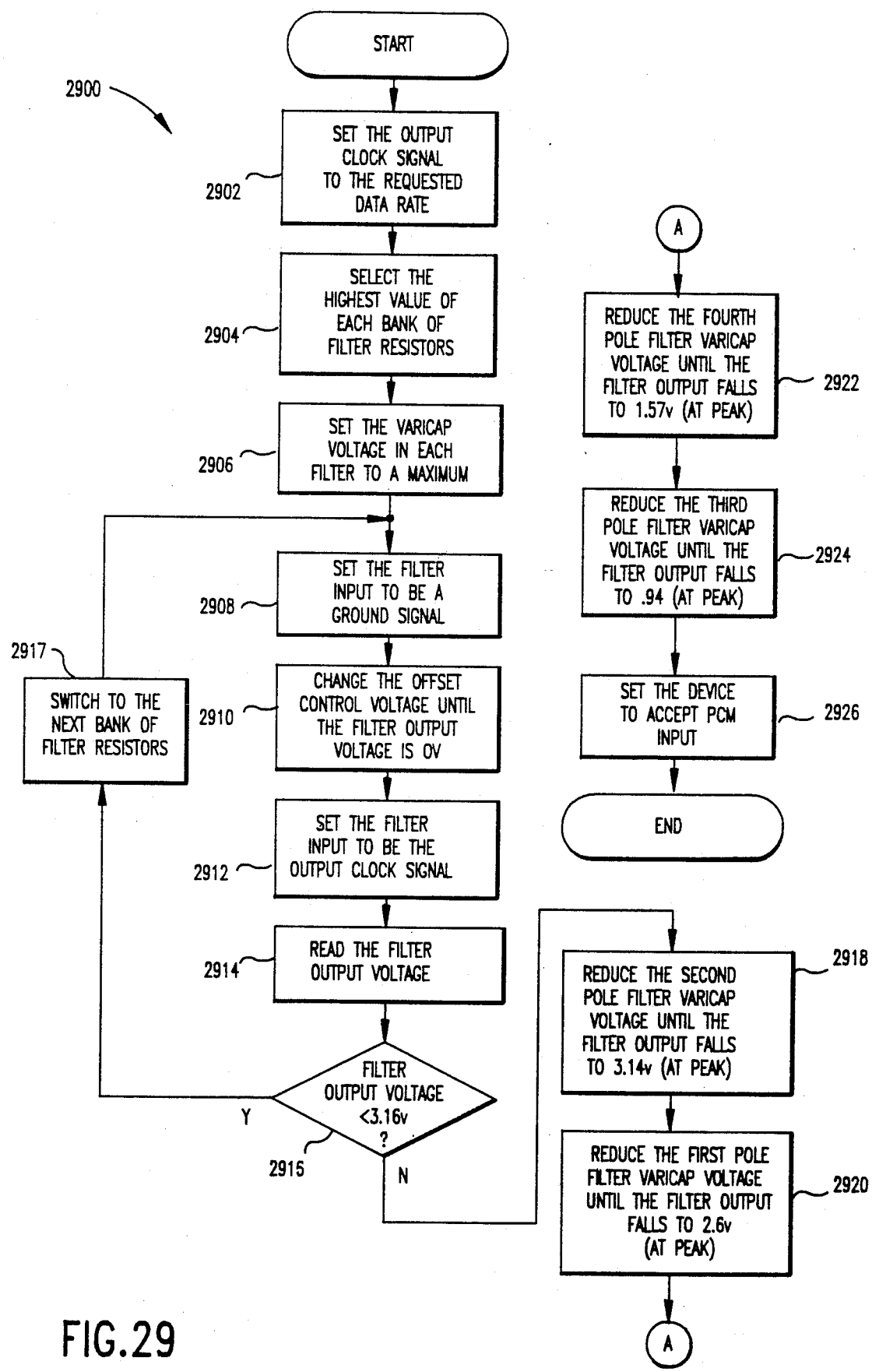
FIG. 29 is a flow chart of a set-up procedure performed in the present invention.

FIG. 29 is a flowchart 2900, including flowchart elements 2902 through 2926. Flowchart 2900 shows a logic flow of steps performed during a set-up procedure of a preferred embodiment of the present invention. After completion of the steps, filter element means 32 of FIGS. 6 and 7 is tuned to a correct cutoff frequency for a given PCM input signal rate. The steps of FIG. 29 preferably are performed by processor 52 and are embodied as object code stored in memory 54.

In step 2902, processor 52 sets the VCO signal according to a requested data rate. The requested data rate (also called a desired data rate) preferably is a value input to processor 52 by a human user and indicating a data rate of the PCM data input to the device. For example, the input can be entered using a personal computer keyboard and then transferred from the personal computer to the device of the present invention. In a preferred embodiment, step 2902 is performed by performing substeps 3002 through 3022 of FIG. 30.

Figure 30:
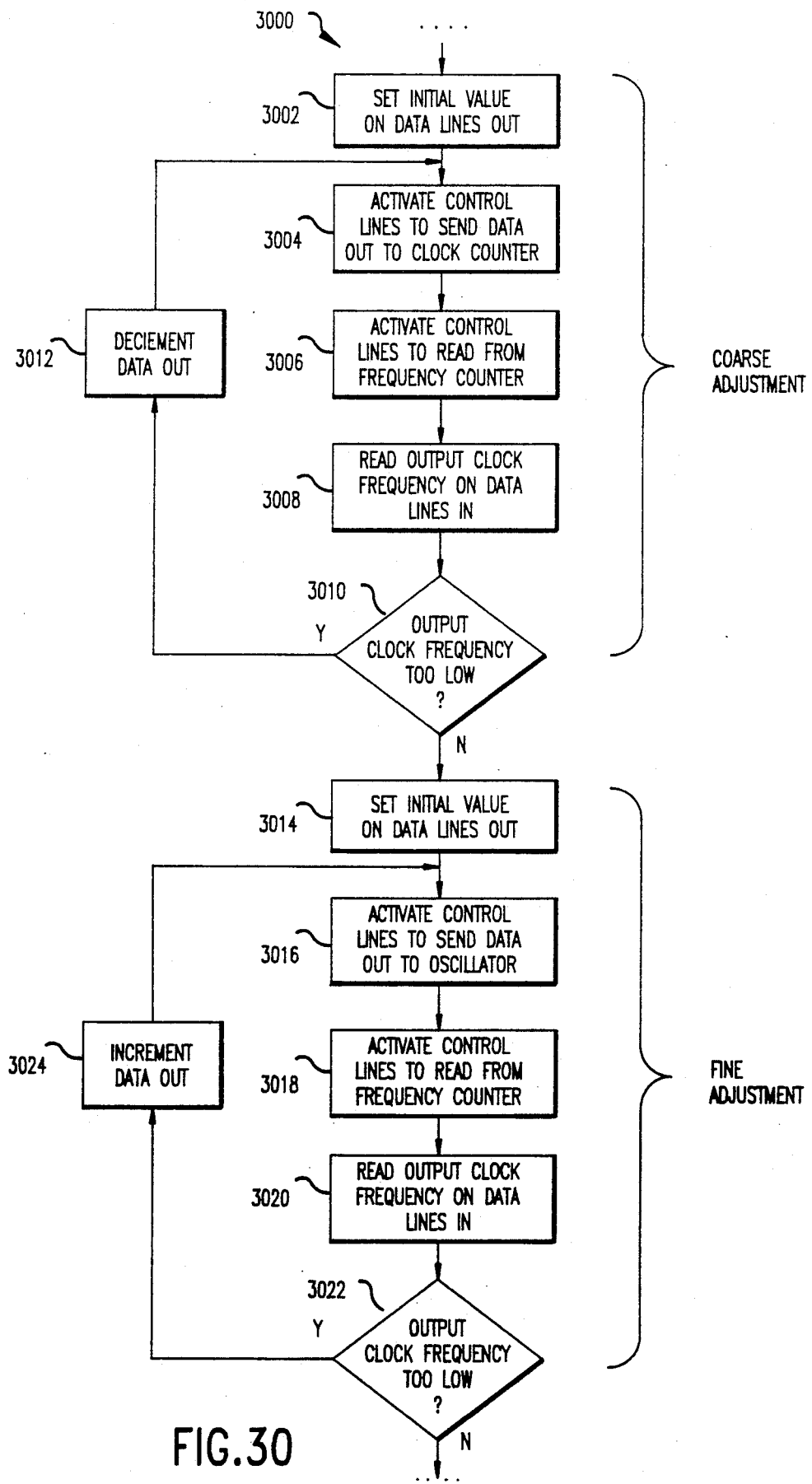
FIG. 30 is a flow chart showing substeps of the flowchart of FIG. 29.

The steps of FIG. 30 preferably are performed by processor 52 and are embodied as object code stored in memory 54. In FIG. 30, first, processor 52 performs a coarse adjustment to the VCO signal rate. In step 3002, processor 52 preferably outputs a binary "0000" signal on lines D4–D7 and activates line CS20, which is input to control latch 100 shown in FIG. 28 during step 3004. Control latch 100 outputs the binary "0000" signal of lines D4–D7 as a binary "0000" signal on lines S0–S3. The signal on lines S0–S3 are input to 16-line demultiplexers U63 and U64 of first clock divider means 78 shown in FIG. 21, to initially select a highest frequency signal on the CLOCK OUT line of FIG. 23. The lines D0–D7 input to each of 16-line demultiplexers U63 and U64 are output from 4-bit binary counters U61, U62, U65, and U66 of FIG. 21. The lines D0–D7, thus, have respective signals of frequencies decreasing by one half. For example, line D0 has a highest frequency, followed by line D1, and so on. In a preferred embodiment, lines D0–D7 have the following frequencies of 2.0 MHz, 1.0 MHz, etc. The actual frequencies depend on the frequency from the voltage controlled oscillator.

The signal of demultiplexers U63 and U64 of FIG. 21 affects the CLOCK signal output from first clock divider mean 78 and input to clock output means 80 of FIG. 23. The FCLK signal output from clock output means 80 of FIG. 23 is input to phase corrector means 74 of FIG. 19, which affects the output of oscillator means 76 of FIG. 19. Oscillator means 76 of FIG. 19 outputs a VCO (third clock) signal. The VCO signal is input to frequency counter means 90 of FIG. 25, which is controlled by a line CSA0 output from processor 52 in step 3006. Frequency counter means 90 outputs a VCO signal rate on lines D0–D7 to processor 52 in step 3008.

When processor 52 reads the VCO signal rate from lines D0–D7, if the VCO signal rate is below the desired data rate in step 3010, the binary value output on lines D4–D7 is decremented and, in step 3012, is output to selector 100 (shown in FIG. 28), as described above in connection with step 3004. Once a frequency value input to processor 52 is above the desired data rate in step 3014, processor 52 increments the binary value output on lines D4–D7 (not shown in FIG. 30) and performs a fine adjustment as described below.

Second, processor 52 performs a fine adjustment to the VCO signal rate according to the desired data rate. In step 3014, processor 52 outputs a binary "000000000000" signal on lines D0–D11 and, in step 3016, processor 52 activates line CS30, which controls D/A converter U37 (or U35) shown in FIG. 20. D/A converter 37 outputs an analog signal DA OUT, which is input to oscillator means 76 (shown in FIG. 19) to perform a fine-tuning action on line clock output line VCO output from oscillator means 76. Again, the VCO signal is input to frequency counter means 90 (as shown in FIG. 25), which outputs a VCO signal rate on lines D0–D7 to processor 52, as described in above in connection with steps 3018 and 3020. Frequency counter means 90, shown in FIG. 25, is controlled by a line CSA0 output from processor 52 in step 3018.

When processor 52 reads the VCO signal rate from lines D0–D7 in step 3020, if the VCO signal rate is below the desired data rate in step 3022, the binary value output on lines D0–D7 is incremented and output to D/A converter U37 (shown in FIG. 20) in step 3024, as described above. Once a frequency value input to processor 52 is below the desired data rate, processor 52 decrements the binary value output to D/A converter U37 on lines D0–D7 (not shown in FIG. 30).

Many minor variations in the above-described steps will be obvious to persons of ordinary skill in the art. For example, values may be incremented instead of decremented, or active-high and active low signals may be reversed. The final decrement step for both the coarse and fine adjustment portions of FIG. 30 are not shown for ease of explanation.

After step 2902 has been performed, and the VCO signal data rate has been adjusted according to a desired data rate, the offset control voltage is adjusted to compensate for amplifier offsets caused by mismatched input impedance during step 2904 through 2910.

In step 2904, processor 52 initially selects a highest value of each bank of filter resistors. In a preferred embodiment, step 2904 is performed by processor 52 outputting a binary value "000" on lines D0-D2 and activates line CS50, which is input to each of the four filter circuits shown in FIGS. 6 and 7. For each filter circuit, the input signal of lines D0-D2 selects a highest resistance value on line 17. In a preferred embodiment, this initially selected resistance value is 432 KOhms. The values of the resistors on lines X1-X7, respectively of each of elements U11, U4, U21, and U17 preferably are: 147 KOhms, 48.7 KOhms, 16.2 KOhms, 5.36 KOhms, 1.74 KOhms, 536 Ohms, and 133 Ohms.

In step 2906, processor 52 sets the variable capacitor voltage in each filter circuit to a maximum voltage. In a preferred embodiment, step 2906 is performed by setting each variable capacitor separately. Processor 52 activates line CSCO and address lines A8 and A9 to control D/A converter U8 shown in FIG. 9. D/A converter U8 outputs an analog signal on a respective one of lines CONT1, CONT2, CONT3 and CONT4 depending on the values of lines A8 and A9. The analog signal output from D/A converter U8 depends on data output on lines D0-D7 by processor 52. The analog signals on lines CONT1 and CONT2 are −8 volt signals and the analog signals on lines CONT3 and CONT4 are +8 volt signals. The analog signal from D/A converter U8 is input to one of variable capacitors VVC1, VVC2, VVC3, and VVC4 of FIG. 7. When all four variable capacitors VVC1, VVC2, VVC3, and VVC4 have been set, control proceeds to step 2908.

In step 2908, processor 52 sets the filter input to be a ground signal. In a preferred embodiment, step 2908 is performed by processor 52 activating line CS60, which controls multiplexer U16 of FIG. 4 to input a ground signal to the filter.

In step 2910, processor 52 changes the offset control voltage until the filter output voltage is 0 Volts. In a preferred embodiment, step 2910 is performed by processor 52 activating line CS55, which controls control offset circuit U6 shown in FIG. 8. A binary value of "00000000" is output on lines D0-D7, which causes control offset circuit U6 to output an analog signal on line OCOMP. The signal on line OCOMP is input to the four filter circuits of filter element means 32. Next, processor 52 monitors lines D0-D7 output from element 2714 of FIG. 27, which is controlled by line CS53 from processor 52. Processor 52 adjusts the binary value output to the control offset circuit until the value on lines D0-D7 from element 2714 of FIG. 27 corresponds to 0 Volts. At this point, the device has compensated for the amplifier offsets caused by mismatched input.

After step 2910 has been performed, and the offset control voltage has been adjusted to compensate for amplifier offsets caused by mismatched input impedance, the filter range resistors have been set to correct values and the amplifier offset has been nulled for a zero Volts offset in steps 2912 through 2916.

In step 2912, processor 52 sets the filter input to be the output clock signal. In a preferred embodiment, step 2912 is performed by processor 52 setting the filter input to be the clock output signal CLOCK from first clock divider means 78. In a preferred embodiment, step 2912 is performed by processor 52 activating line CS60, which controls multiplexer U6 of FIG. 8 to input signal CLOCK to the filter.

In step 2914, processor 52 reads the filter output voltage. In a preferred embodiment, step 2914 is performed by processor 52 activating line CS53, which controls element 2714 of FIG. 27, and then reading lines D0-D7 from element 2714.

In step 2916, processor 52 determines whether the filter output voltage read in step 2914 is less than 3.16 Volts. The value 3.16 was arrived at empirically and other, different voltages may be used with different embodiments of the present invention. In a preferred embodiment, step 2916 is performed by processor 52 comparing the value read on lines D0-D7 with a pre-stored value. This value read represents a voltage from 0 Volts to a peak of the signal. In a different embodiment inputting a peak-to-peak signal, the prestored value would be approximately twice that of the described embodiment.

In step 2916, if the read value is less than 3.16 Volts, then control passes to step 2917. In step 2917, processor 52 outputs an incremented binary value on lines D0-D2 and activates line CS50, which is input to each of the four filter circuits of filter element means 32 of FIGS. 6 and 7. For each filter circuit, the input signal of lines D0-D2 selects a next resistance value in the resistor elements of each filter circuit.

In step 2916, if the read value is greater than or equal to 3.16 Volts, then control passes to step 2918. The value 3.16 has been selected empirically and may vary in different embodiments of the present invention.

After step 2916 is performed for the last time, the filter range resistors are the correct value and the amplifier offset has been nulled for a zero Volts offset. Steps 2918 through 2924 tune the filter to the correct cutoff frequency the selected data rate.

In step 2918, processor 52 reduces the second filter circuit variable capacitor voltage until the filter output from lines D0-D7 of element 2714 of FIG. 27 falls to 3.14 Volts at peak. In a preferred embodiment, step 2918 is performed by processor 52 outputting a binary value on each of lines A8 and A9 to control D/A U8 of FIG. 9, indicating the second filter circuit. D/A converter U8 outputs an analog signal on line CONT2 in accordance with the values of lines D0-D7. The analog signal from D/A converter U8 of FIG. 9 is input to variable capacitor VVC2. Processor 52 reads a voltage from lines D0-D7 of element 2714 of FIG. 27, which is controlled by line CS52. The process of setting variable capacitor VVC2 and reading the filter output continues until the filter output falls to or below 3.14 Volts, and control proceeds to step 2920.

In step 2920, processor 52 reduces the first filter circuit variable capacitor voltage until the filter output from lines D0-D7 of element 2714 of FIG. 27 falls to 2.67 Volts at peak. In a preferred embodiment, step 2920 is performed by processor 52 outputting a binary value on each of lines A8 and A9 to control D/A U8 of FIG. 9, indicating the first filter circuit. D/A converter U8 outputs an analog signal on line CONT1 in accordance with the values of lines D0-D7. The analog signal from D/A converter U8 of FIG. 9 is input to variable capacitor VVC1. Processor 52 reads a voltage from lines D0-D7 of element 2714 of FIG. 27, which is controlled by line CS52. The process of setting variable capacitor VVC1 and reading the filter output continues until the filter output falls to or below 2.67 Volts, and control proceeds to step 2922.

In step 2922, processor 52 reduces the fourth filter circuit variable capacitor voltage until the filter output from lines D0-D7 of element 2714 of FIG. 27 falls to 1.57 Volts at peak. In a preferred embodiment, step 2922 is performed by processor 52 outputting a binary value on each of lines A8 and A9 to control D/A U8 of FIG. 9, indicating the fourth filter circuit. D/A converter U8 outputs an analog signal on line CONT4 in accordance with the values of lines D0-D7. The analog signal from D/A converter U8 of FIG. 9 is input to variable capacitor VVC4. Processor 52 reads a voltage from lines D0-D7 of element 2714 of FIG. 27, which is controlled by line CS52. The process of setting variable capacitor VVC4 and reading the filter output continues until the filter output falls to or below 1.57 Volts, and control proceeds to step 2924.

In step 2924, processor 52 reduces the third filter circuit variable capacitor voltage until the filter output from lines D0-D7 of element 2714 of FIG. 27 falls to 0.94 Volts at peak. In a preferred embodiment, step 2924 is performed by processor 52 outputting a binary value on each of lines A8 and A9 to control D/A U8 of FIG. 9, indicating the third filter circuit. D/A converter U8 outputs an analog signal on line CONT3 in accordance with the values of lines D0-D7. The analog signal from D/A converter U8 of FIG. 9 is input to variable capacitor VVC3. Processor 52 reads a voltage from lines D0-D7 of element 2714 of FIG. 27, which is controlled by line CS52. The process of setting variable capacitor VVC3 and reading the filter output continues until the filter output falls to or below 0.94 Volts, and control proceeds to step 2926.

After step 2924, the filter is tuned to a correct cutoff frequency for the selected data rate. In step 26, processor 52 controls multiplexer U16 of FIG. 4 to begin receiving the RDATA signal.

ii) Operation

Figure 31:
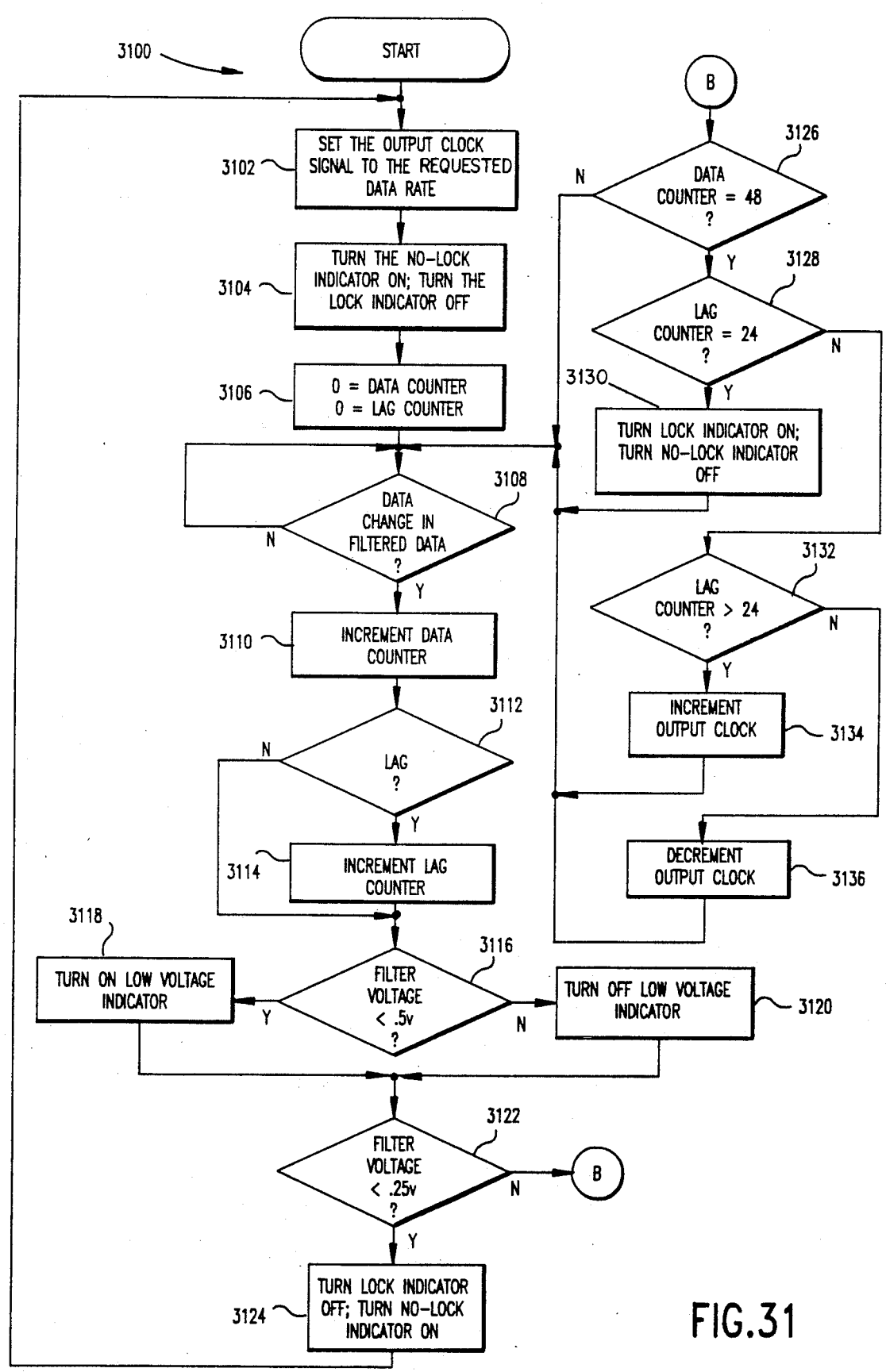
FIG. 31 is a flow chart of an operation procedure performed in the present invention.

FIG. 31 is a flowchart 3100, including flowchart elements 3102 through 3136. Flowchart 3100 shows a logic flow of steps performed during operation of a preferred embodiment. The steps preferably are performed after the steps of FIG. 30 and are repeated during operation of the preferred embodiment to continually adjust the frequency of the VCO (third clock) signal to compensate for variances in a PCM input signal. The steps of FIG. 31 preferably are performed by processor 52 and are embodied as object code stored in memory 54 as shown in FIG. 27.

In step 3102, processor 52 sets the VCO signal according to a requested data rate. Step 3102 is similar to step 2902 of FIG. 29. The requested data rate (also called a desired data rate) preferably is a value input by a human user and indicates a data rate of the PCM input signal input to the device. In a preferred embodiment, step 3102 is performed by performing substeps 3002 through 3022 of FIG. 30, as described in connection with step 2902 above.

After step 3102 has been performed, and the VCO signal rate has been adjusted according to a desired data rate, control passes to step 3104. It will be understood that several steps in FIG. 31 dealing with turning indicators on and off are optional steps and may be omitted without departing from the scope of the present invention.

In step 3104, processor 52 turns on a No-Lock indicator and turns off a Lock indicator. This step is preferably performed by processor 52 activating various ones of light emitting diodes (LEDs) 2710 shown in FIG. 27.

In step 3106, processor 52 sets a value of "0" in a data counter and a lag counter. Preferably, the data counter and lag counter are located in memory 54 or some similar memory accessible to processor 52.

In step 3108, processor 52 waits for a data change to be detected in filtered data from filter means 30. Preferably, processor 52 monitors a line EF3 output from element U59 of FIG. 14, which is controlled by line CS40 from processor 52. Line EF3 indicates when the FDATA signal changes from a "0" to a "1". Data from filter means 30 is output as a TTDATA signal to the optional inverter circuit shown in FIG. 13, which outputs an FDATA signal. The FDATA signal is input to D-flip flop U59 shown in FIG. 14, where it is output as a DATA VALID signal on line EF3, which is input to processor 52. When a signal is detected on line EF3, processor 52 increments the data counter in step 3110.

Next, in step 3112, processor 52 determines whether the VCO signal is lagging the input PCM signal, i.e., determines whether the FCLK signal is lagging the FDATA signal. Preferably, processor 52 checks a line EF2 from phase comparator means 72 of FIG. 18. If the line is active, indicating a lag, then processor 52 increments the lag counter in step 3114.

In step 3116, processor 52 determines whether the output filter voltage is less than 0.5 Volts. This is preferably done by processor 52 reading lines D0-D7 from element 2714 of FIG. 27, which is controlled by line CS52 from processor 52. If the output filter voltage is less than 0.5 Volts, then, in step 3118, processor 52 turns low voltage indicator on. Otherwise, in step 3120, processor 52 turns the low voltage indicator off.

In step 3122, processor 52 determines whether the output filter voltage is less than 0.25 Volts in a manner similar to the manner of step 3116. If the output filter voltage is less than 0.25 Volts, then the VCO signal needs to be readjusted and control passes to step 3102. Otherwise, control passes to step 3126.

In step 3126, processor 52 determines whether the data counter is equal to "48". If not, control passes to step 3108. Otherwise, in step 3128, processor 52 determines whether the lag counter is equal to "24". If this is the case, the VCO signal is neither leading nor lagging the input signal, and control passes to step 3108. If not, the VCO signal is either leading or lagging the input signal.

If, in step 3132, processor 52 determines that the lag counter is greater than "24", then the VCO signal is lagging the input signal and, in step 3134, processor 52 increments the VCO signal as described below. Otherwise, the VCO signal is leading the input signal and, in step 3136, processor 52 decrements the VCO signal as described below.

To either increment or decrement the VCO signal, processor 52 preferably respectively increments or decrements the binary value output on lines D0-D7 to element U23, controlled by line CS20, as described above in connection with step 2902. The values on lines D0-D7 affect the signals S0-S2 that are input to clock counter 78 of FIG. 21 and multiplexer 86 of FIG. 23, thus affecting the VCO signal and correcting for lead or lag in the clock signal.

Optionally, at this time, processor 52 may also perform a loop bandwidth control procedure (not shown) to control fast tape jitter. A human operator, through the personal computer interface, may select one of 0.5%, 1%, 2%, and 5%. Processor 52 slows or speeds up one clock by the selected percentage by generating signals on lines LBW1 or LBW2 of FIG. 19. Alternately, the signals on lines LBW1 and LBW2 are set to "0," indicating a 1% loop bandwidth.

Thus, the bit synchronizer of the present invention is digitally controlled and has a high performance speed and a low power requirement. Moreover, the described embodiment of the present invention weighs approximately one pound and locks onto a pulse code modulated data in the time it takes to receive one bit. In addition, the present invention does not require periodic calibration.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. An apparatus, comprising:
   input means for receiving and processing a pulse code modulated input signal having a first predetermined code format and for outputting a preliminary signal;
   filter means, responsive to a control means, for filtering the preliminary signal and for outputting a filtered signal;
   code converter means, responsive to the control means and a clock means, for converting the filtered signal and for outputting an output data signal having a second predetermined code format;
   clock means, responsive to the filtered signal, the code converter means, and the control means, for outputting the output clock signal in a predetermined phase with the output data signal; and
   control means, responsive to user controlled inputs, for digitally controlling the operation of the filter means, the code converting means, and the clock means.

2. The apparatus of claim 1, wherein:
   the input means includes:
      AC coupler means for removing a DC offset of the pulse code modulated input signal and for outputting a first signal, and
      input buffer means for inputting the first signal and outputting the preliminary signal to the filter means, the input buffer means including subtracter means for subtracting an offset correction signal from the first signal; and
   the filter means includes:
      filter element means for filtering the preliminary signal and for outputting a partially filtered signal,
      AC offset means for correcting an AC offset of the partially filtered signal, and for outputting the offset correction signal to the subtracter means, and
      detector means for detecting when the partially filtered signal crosses zero voltage and for outputting the filtered signal.

3. The apparatus of claim 2, wherein the filter element means include a filter circuit comprising:
   a multi-channel analog multiplexer;
   resistor elements, each having two leads, a first lead of each resistor being connected to a channel of the multiplexer, and a second lead of each resistor being attached together at a first node point; and
   a variable capacitor having two leads, a first lead of the variable capacitor being attached to the first node point and a second lead of the variable capacitor being adapted to receive a control input.

4. The apparatus of claim 3, wherein the filter element means further comprises:
   a plurality of filter circuits; and
   first buffer means for connecting the first node point of a first filter circuit to the multiplexer of a second filter circuit.

5. The apparatus of claim 4, wherein the filter element means further comprises second buffer means for connecting the first node point of the second filter circuit to both the multiplexer of a third filter circuit and the second lead of the variable capacitor of the first filter circuit.

6. The apparatus of claim 5, wherein the filter element means further comprises third buffer means for connecting the first node point of the third filter circuit to the multiplexer of a fourth filter circuit.

7. The apparatus of claim 6, wherein the filter element means further comprises fourth buffer means for connecting the first node point of the fourth filter circuit to the second lead of the variable capacitor of the third filter circuit.

8. The apparatus of claim 7, wherein the filter means further comprises offset compensation means for compensating for the offset caused by the buffer means of the filter element means.

9. The apparatus of claim 2, wherein the AC offset means includes:
   positive peak detector means, responsive to the partially filtered signal, for detecting and storing a maximum voltage of the partially filtered signal and for outputting a maximum signal;
   negative peak detector means, responsive to the partially filtered signal, for detecting and storing a minimum voltage of the partially filtered signal and for outputting a minimum signal;
   peak detector reset means for resetting the positive and negative peak detector means by causing a discharge of a portion of the voltage stored in the positive and negative peak detector means; and
   adder means for adding the minimum signal to the maximum signal and for outputting the offset correction signal.

10. The apparatus of claim 9, wherein the peak detector reset means includes discharge means, responsive to the filtered signal and the clock means, for causing the discharge of the portion of the voltage stored in the positive and negative peak detector means.

11. The apparatus of claim 1, wherein the code converter means includes:
   a Miller decoder having Miller outputs;
   a Bi-Phase decoder having Bi-Phase outputs;
   an NRZ decoder having NRZ outputs; and
   data multiplexer means, responsive to an input code format signal from the control means, the Miller outputs, the Bi-Phase outputs, and the NRZ outputs for outputting the output data signal.

12. The apparatus of claim 1, wherein the code converter means includes:
   a Miller decoder having Miller outputs;
   a Bi-Phase decoder having Bi-Phase outputs;
   an NRZ decoder having NRZ outputs;
   data multiplexer means, responsive to an input code format signal from the control means, the Miller outputs, the Bi-Phase outputs, and the NRZ outputs for outputting an initial output data signal; and
   randomizer means, responsive to the clock means and the control means, for selectively adding a waveform to the initial output data signal, and for outputting the output data signal.

13. The apparatus of claim 1, wherein the clock means includes:
   phase comparator means for comparing the phase of the filtered signal with the phase of a first clock signal, and for outputting a lead/lag signal;
   phase corrector means, responsive to a resistance set signal from the control means, for adjusting the phase of the lead/lag signal toward the phase of the filtered signal, and for outputting a second clock signal wherein the control means includes means, responsive to the lead/lag signal, for outputting the resistance set signal and a clock adjust signal;
   oscillator means, responsive to the clock adjust signal and the second clock signal, for outputting a third clock signal;
   first clock divider means, responsive to a first divider signal from the control means, for reducing the frequency of the third clock signal, and for outputting a fourth clock signal; and
   clock output means, responsive to the fourth clock signal, an input code format signal from the control means, and the code converter means, for outputting the first clock signal and for outputting the output clock signal.

14. The apparatus of claim 13, wherein the clock output means includes:
   second clock divider means for dividing the fourth clock signal and outputting a fifth clock signal; and
   clock selector means, responsive to the input code format signal, for selecting between the fourth clock signal and the fifth clock signal to be output as the first clock signal, and for outputting the first clock signal.

15. The apparatus of claim 14, wherein the clock output means further includes clock output multiplexer means, responsive to the fifth clock signal, the input code format signal, and the code converter means, for outputting the output clock signal.

16. The apparatus of claim 14, wherein the clock output means further includes:
   clock output multiplexer means, responsive to the fifth clock signal, the input code format signal, and the code converter means, for outputting an initial output clock signal; and
   clock output phase selector means, responsive to an output phase shift signal from the control means, for optionally shifting the phase of the initial output clock signal and for outputting the output clock signal.

17. The apparatus of claim 1, further including frequency counter means for determining the frequency of a clock signal from the clock means.

18. The apparatus of claim 1, further including low frequency detecting means for detecting the frequency of the pulse code modulated input signal.

19. A digitally controlled filter element including a filter circuit, the filter circuit comprising:
   a multi-channel analog multiplexer;
   resistor elements, each having two leads, a first lead of each resistor being connected to a channel of the multiplexer, and a second lead of each resistor being attached together at a first node point; and
   a variable capacitor having two leads, a first lead of the variable capacitor being attached to the first node point and a second lead of the variable capacitor being adapted to receive a control input from a digital control means.

20. The filter element of claim 19, further comprising:
   a plurality of filter circuits; and
   first buffer means for connecting the first node of a first filter circuit to the multiplexer of a second filter circuit.

21. The filter element of claim 20, further comprising second buffer means for connecting the first node of the second filter circuit to both the multiplexer of a third filter circuit and the second lead of the variable capacitor of the first filter circuit.

22. The filter element of claim 21, further comprising third buffer means for connecting the first node of the third filter circuit to the multiplexer of a fourth filter circuit.

23. The filter element of claim 22, further comprising fourth buffer means for connecting the first node of the fourth filter circuit to the second lead of the variable capacitor of the third filter circuit.

24. The filter element of claim 23, further comprising offset compensation means for compensating for the offset caused by the buffer means of the filter circuits.

25. A clock adjust circuit, comprising:
   phase comparator means for comparing the phase of a filtered signal with the phase of a first clock signal, and for outputting a lead/lag signal;
   phase corrector means, responsive to a resistance set signal from the control means, for adjusting the phase of the first clock signal toward the phase of the filtered signal in response to the lead/lag signal, and for outputting a second clock signal;
   oscillator means, responsive to a clock adjust signal from a control means and the second clock signal, for outputting a third clock signal, wherein the control means includes means for determining a trend in adjustments occurring in the phase corrector and for generating the clock adjust signal to effect the frequency of the third clock signal;
   first clock divider means, responsive to a first divider signal from the control means, for reducing the frequency of the third clock signal and for outputting a fourth clock signal; and
   clock output means, responsive to the fourth clock signal, an input code format signal from the control means, and the code converter means, for outputting the first clock signal and for outputting the output clock signal.

26. The apparatus of claim 25, wherein the clock output means includes:
   second clock divider means for dividing the fourth clock signal and outputting a fifth clock signal; and
   clock selector means, responsive to the input code format signal, for selecting between the fourth clock signal and the fifth clock signal to be output as the first clock signal, and for outputting the first clock signal.

27. The apparatus of claim 26, wherein the clock output means further includes clock output multiplexer means, responsive to the input code format signal and the code converter means, for outputting the output clock signal.

28. The apparatus of claim 27, wherein the clock output means further includes clock output phase selector means, responsive to an output phase shift signal from the control means, for optionally shifting the phase of the output clock signal.

29. The clock adjust circuit of claim 25, wherein the frequency of the third clock signal is substantially in the range of 7-30 MHz.

* * * * *